(12) United States Patent
Aiga et al.

(10) Patent No.: US 9,190,614 B2
(45) Date of Patent: Nov. 17, 2015

(54) NON-VOLATILE MEMORY DEVICE

(71) Applicant: KABUSHIKI KAISHA TOSHIBA, Minato-ku, Tokyo (JP)

(72) Inventors: Fumihiko Aiga, Kanagawa-ken (JP); Takeshi Yamaguchi, Mie-ken (JP); Shigeki Kobayashi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 13/964,461

(22) Filed: Aug. 12, 2013

(65) Prior Publication Data

US 2014/0063912 A1  Mar. 6, 2014

(30) Foreign Application Priority Data

Aug. 31, 2012 (JP) ................. 2012-192621

(51) Int. Cl.
| | | |
|---|---|---|
| G11C 11/00 | (2006.01) | |
| H01L 45/00 | (2006.01) | |
| G11C 13/00 | (2006.01) | |
| H01L 27/24 | (2006.01) | |

(52) U.S. Cl.
CPC .......... *H01L 45/145* (2013.01); *G11C 13/0007* (2013.01); *G11C 13/0069* (2013.01); *H01L 27/2409* (2013.01); *H01L 27/2463* (2013.01); *H01L 27/2481* (2013.01); *H01L 45/08* (2013.01); *H01L 45/1233* (2013.01); *H01L 45/146* (2013.01); *H01L 45/147* (2013.01); *G11C 2213/71* (2013.01); *G11C 2213/72* (2013.01); *H01L 27/2436* (2013.01)

(58) Field of Classification Search
CPC .................. G11C 13/0069; G11C 13/0004
USPC ................... 365/148, 163, 158, 171, 173
See application file for complete search history.

(56) References Cited

U.S. PATENT DOCUMENTS

| | | | | |
|---|---|---|---|---|
| 8,138,489 | B2 * | 3/2012 | Tanaka et al. ............... | 257/4 |
| 8,144,498 | B2 * | 3/2012 | Kumar et al. .............. | 365/148 |
| 8,735,959 | B2 * | 5/2014 | Dornel ......................... | 257/314 |
| 2012/0012807 | A1 | 1/2012 | Yamaguchi et al. | |

FOREIGN PATENT DOCUMENTS

JP    2012-23271    2/2012

* cited by examiner

*Primary Examiner* — Son Dinh
(74) *Attorney, Agent, or Firm* — Finnegan, Henderson, Farabow, Garrett & Dunner, L.L.P.

(57) ABSTRACT

According to an embodiment, a non-volatile memory device includes a first conductive layer, a second conductive layer, and a resistance change layer provided between the first conductive layer and the second conductive layer. The resistance change layer is capable of making a transition between a low-resistance state and a high-resistance state, and includes an oxide containing at least one of hafnium (Hf) and zirconium (Zr), at least one selected from the group consisting of barium (Ba), lanthanum (La), gadolinium (Gd) and lutetium (Lu), and nitrogen (N).

15 Claims, 20 Drawing Sheets

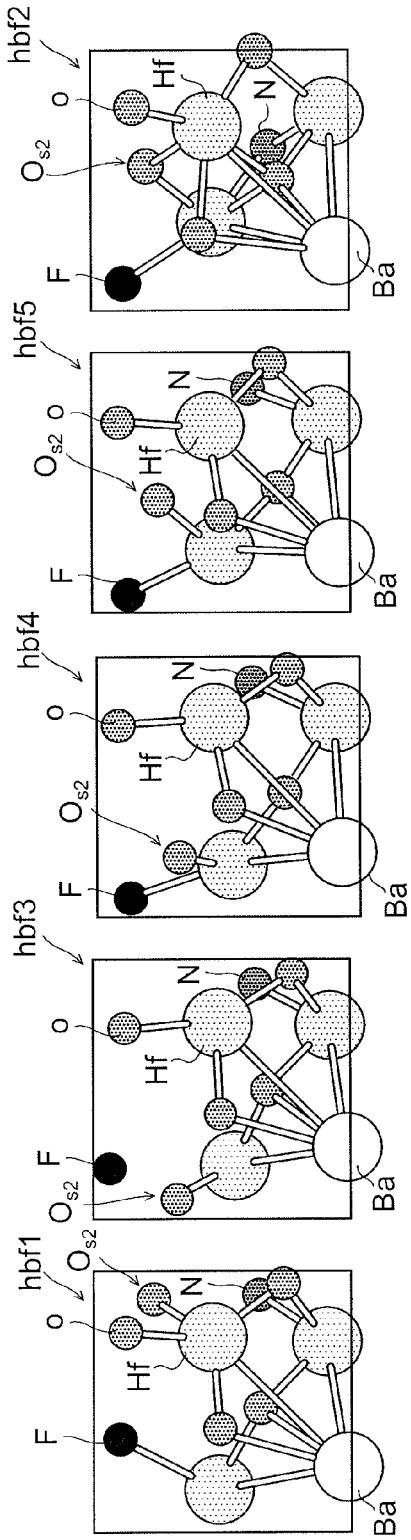
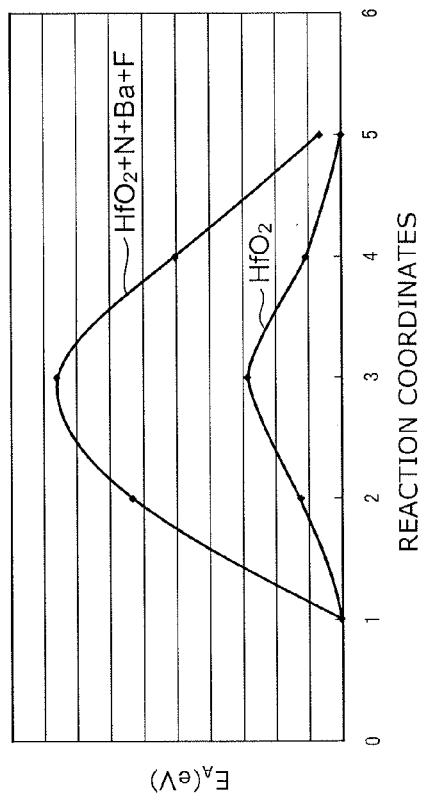
FIG. 13A  FIG. 13B  FIG. 13C  FIG. 13D  FIG. 13E
FIG. 13F

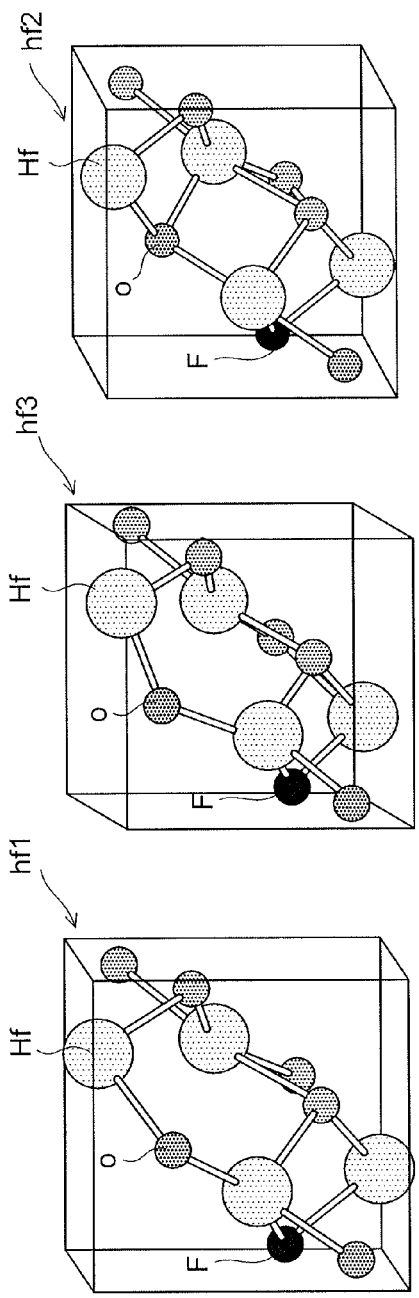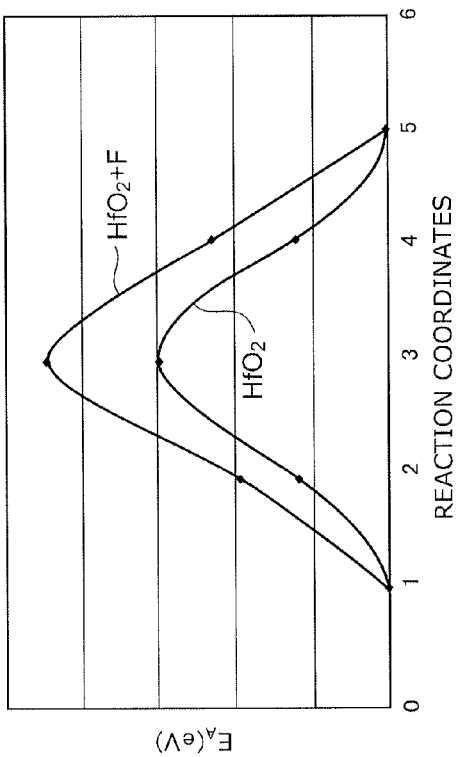
FIG. 15A  FIG. 15B  FIG. 15C  FIG. 15D

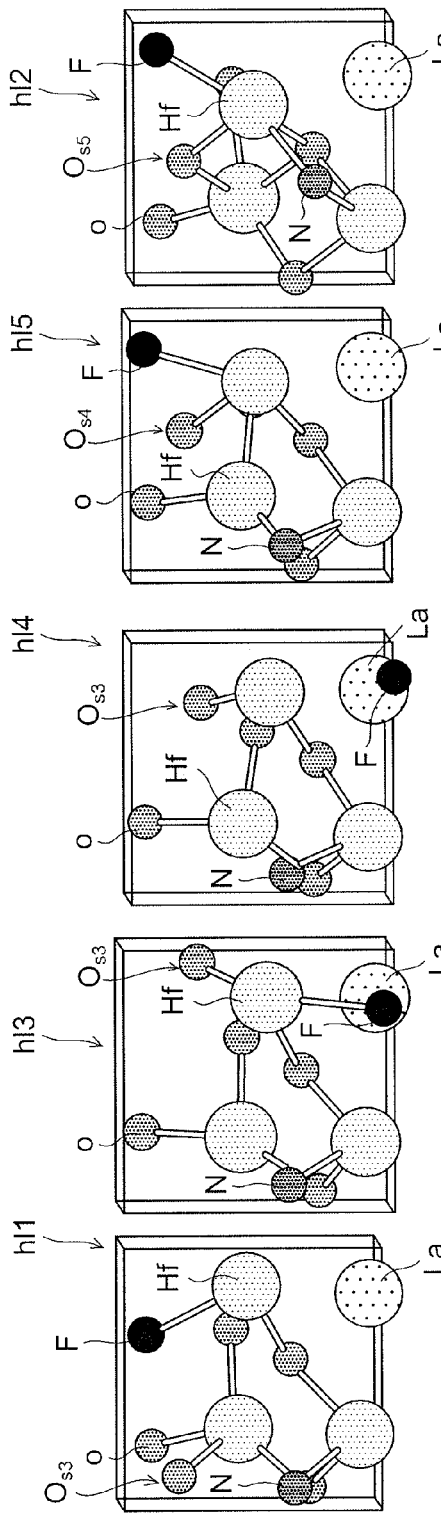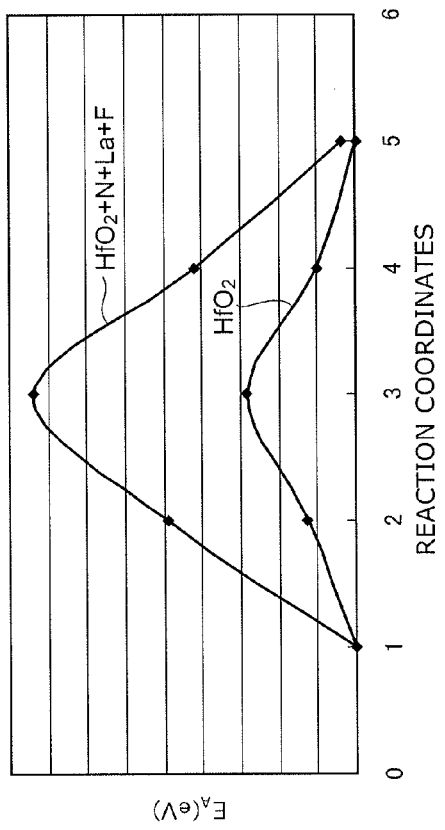
FIG. 18A  FIG. 18B  FIG. 18C  FIG. 18D  FIG. 18E  FIG. 18F

_US 9,190,614 B2_

NON-VOLATILE MEMORY DEVICE

CROSS-REFERENCE TO RELATED APPLICATIONS

This application is based upon and claims the benefit of priority from Japanese Patent Application No. 2012-192621, filed on Aug. 31, 2012; the entire contents of which are incorporated herein by reference.

BACKGROUND

A resistance change memory has large potential for realizing a non-volatile memory device in the next generation. A resistance change film included in the resistance change memory is less likely to be deteriorated even in a highly defined size, and may have an advantage for manufacturing a huge capacity memory.

To enhance a memory characteristic in such a resistance change memory, there is room for improvement. For example, it is desired to make filament-forming easier in the initialization process. Also, it is desired to more stably maintain a changed state of the resistance change film.

BRIEF DESCRIPTION OF THE DRAWINGS

FIGS. 12A to 13f are schematic views illustrating characteristics of the non-volatile memory device according to the second embodiment;

FIGS. 14A to 15D are schematic views illustrating characteristics of a non-volatile memory device according to a reference example;

FIGS. 17A to 18f are schematic views illustrating characteristics of the non-volatile memory device according to the third embodiment;

DETAILED DESCRIPTION

According to an embodiment, a non-volatile memory device includes a first conductive layer, a second conductive layer, and a resistance change layer provided between the first conductive layer and the second conductive layer. The resistance change layer is capable of making a transition between a low-resistance state and a high-resistance state, and includes an oxide containing at least one of hafnium (Hf) and zirconium (Zr), at least one selected from the group consisting of barium (Ba), lanthanum (La), gadolinium (Gd) and lutetium (Lu), and nitrogen (N).

Hereinafter, embodiments of the invention will be described with reference to the drawings.

Note that the drawings are schematic and conceptual ones, and the relationship between the thickness and the width of each part, a proportionality coefficient of the size between parts, and the like may not necessarily be the same as reality. Also, even cases where the same part is shown, mutual sizes or proportionality coefficients may be differently shown.

Also, in the specification and the drawings, elements similar to those described in a previous drawing will be denoted with the same reference numbers and detailed description is appropriately omitted.

<First Embodiment>

Figure 1:
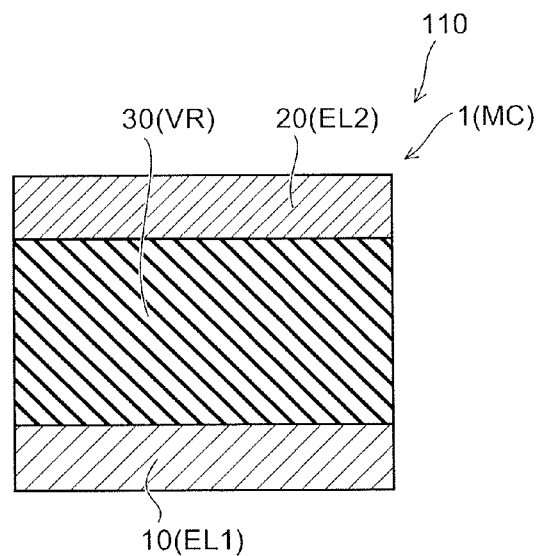
FIG. 1 is a schematic cross-sectional view illustrating a non-volatile memory device according to a first embodiment.

FIG. 1 is a schematic cross-sectional view illustrating a non-volatile memory device according to a first embodiment.

As shown in FIG. 1, a non-volatile memory device 110 according to the embodiment includes a first conductive layer 10, a second conductive layer 20, and a resistance change layer 30. The resistance change layer 30 is provided between the first conductive layer 10 and the second conductive layer 20. The resistance change layer 30 is capable of making a transition between a low-resistance state and a high-resistance state. An example of the resistance change layer 30 will be described below.

Figure 2:
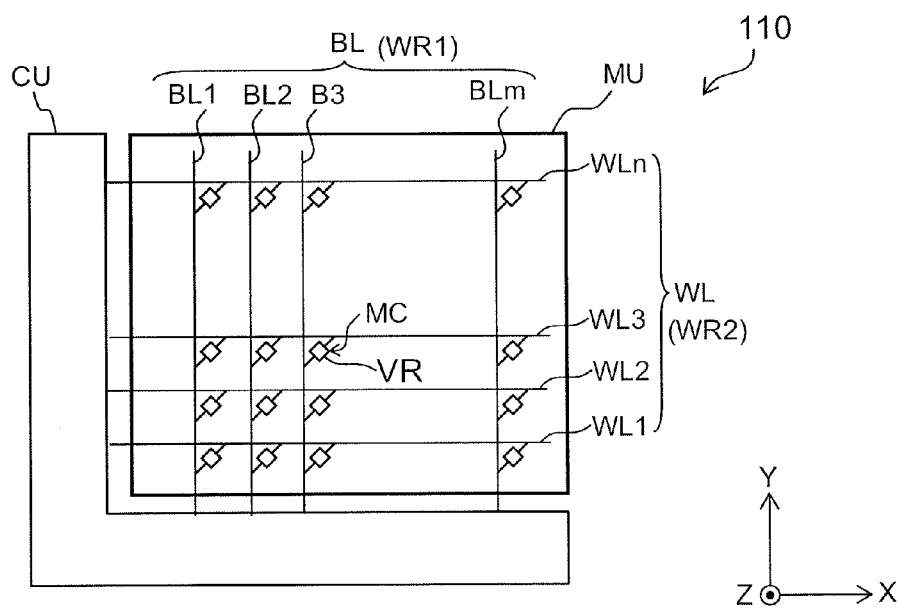
FIGS. 2 to 4 are schematic views illustrating a configuration of the non-volatile memory device according to the first embodiment.
Figure 3:
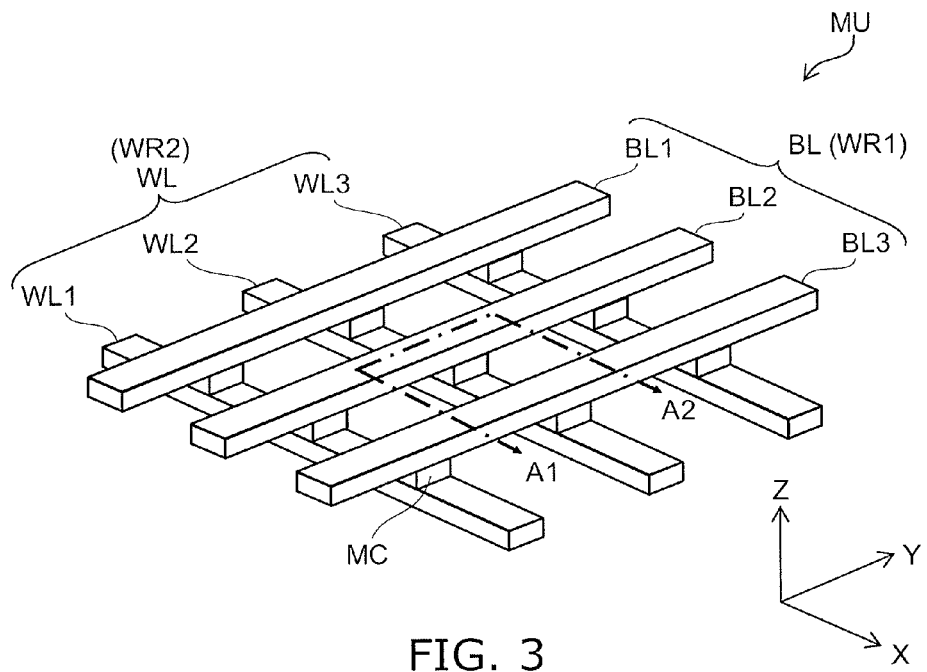
Figure 4:
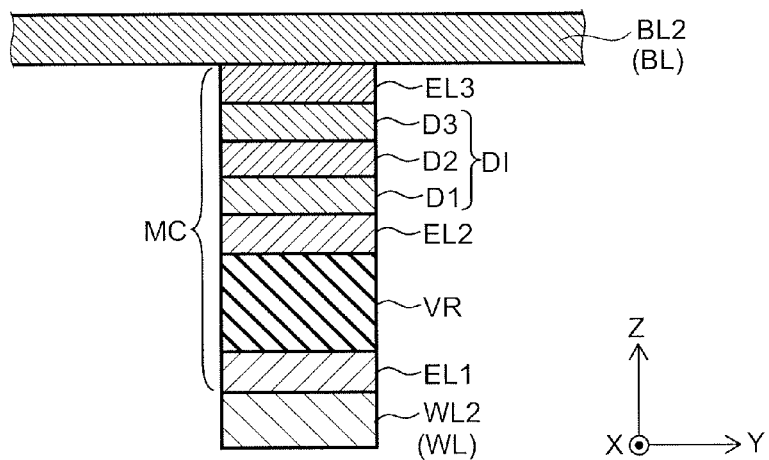

FIGS. 2 to 4 are schematic views illustrating a configuration of the non-volatile memory device according to a first embodiment.

FIG. 3 is a schematic perspective view. FIG. 4 is a schematic cross-sectional view.

An example of an outline of the non-volatile memory device according to the embodiment will be described with reference to FIGS. 2 to 4.

As shown in FIG. 2, the non-volatile memory device 110 according to the embodiment includes a memory unit MU and a control unit CU, for example.

The memory unit MU includes a first interconnection WR1, a second interconnection WR2, and a memory cell MC.

The second interconnection WR2 extends into a direction not parallel with an extending direction of the first interconnection WR1. In the specific example, the extending direction of the first interconnection WR1 and the extending direction of the second interconnection WR2 are perpendicular to each other. The first interconnection WR1 extends along a Y-axis direction, for example, and the second interconnection WR2 extends along an X-axis direction perpendicular to the Y-axis direction, for example. A direction perpendicular to the X-axis direction and to the Y-axis direction is a Z-axis direction.

A plurality of first interconnections WR1 is provided, for example. That is, each of the plurality of first interconnections WR1 extends along the Y-axis direction, and the plurality of first interconnections WR1 are arranged side-by-side along the X-axis direction. A plurality of second interconnections WR2 is provided. That is, each of the plurality of second interconnections WR2 extends along the X-axis direction, and the plurality of second interconnections WR2 are arranged side-by-side along the Y-axis direction.

The first interconnection WR1 is, for example, a bit line BL. The second interconnection WR2 is, for example, a ward line WL. Note that the embodiment is not limited to the above example, and the first interconnection WR1 may be the ward line WL, and the second interconnection WR2 may be the bit line BL. That is, the first interconnection WR1 and the second interconnection WR2 are replaceable with each other. Hereinafter, an example will be described, in which the first interconnection WR serves as the bit line BL and the second interconnection WR2 serves as the ward line WL.

Here, a plurality of bit lines BL includes, for example, first bit line BL1 to m-th bit line BLm (here, m is an integer of 2 or more). A plurality of ward lines WL includes, for example, first ward line WL1 to n-th ward lines WLn (here, n is an integer of 2 or more).

It is desirable for the first interconnection WR1 and the second interconnection WR2 to use a heat-resistant material having low resistance. At least any one of W, WSi, NiSi, and CoSi is used for the first interconnection WR1 and the second interconnection WR2, for example.

As shown in FIGS. 3 and 4, the memory cell MC is provided at an intersection of the first interconnection WR1 and the second interconnection WR2. That is, each of a plurality of memory cells MC is provided at each intersection of the plurality of first interconnections WR1 and the plurality of second interconnections WR2. Each of the plurality of memory cells MC is provided between any one of the plurality of first interconnections WR1 and any one of the plurality of second interconnections WR2. For example, the first interconnection WR1, the memory cell MC, and the second interconnection WR2 are stacked along the Z-axis direction.

Note that, in the specification, "stack" includes a case in which the interconnections and the cell are stacked interposing another element therebetween, other than the case in which the interconnections and the cell are directly stacked.

Note that, in FIG. 3, three bit lines BL (for example, three first interconnections WR1) are illustrated, and three ward lines WL (for example, three second interconnections WR2) are illustrated, for convenience. However, as already described above, the bit lines BL and the ward lines WL may take any number.

As shown in FIG. 4, the memory cell MC includes a resistance change layer VR (resistance change layer 30). That is, each of the plurality of memory cells MC includes a resistance change layer VR. In the resistance change layer VR, at least one of a voltage applied to and a current flowing through the first interconnection WR1 and the second interconnection WR2 change the resistance. That is, the resistance of the resistance change layer VR is changed based on at least one of the voltage applied or the current flowing through the first interconnection WR1 and the second interconnection WR2.

The memory cell MC can further include, for example, a first electrode EL1, a second electrode EL2, and a third electrode EL3. In the example, the first electrode EL1 is electrically connected to the ward line WL, for example, the third electrode EL3 is electrically connected to the bit line BL, for example, and the second electrode EL2 is provided between the first electrode EL1 and the third electrode EL3. For example, the resistance change layer VR is provided between the first electrode EL1 and the second electrode EL2. The first electrode EL1 and the second electrode EL2 may also serve as a barrier metal and an adhesive layer, for example.

The memory cell MC further includes a rectifying device DI (switching device) provided between the second electrode EL2 and the third electrode EL3, for example. In the specific example, the rectifying device DI includes a first semiconductor layer D1 disposed on a side of the second electrode EL2 (on a side of the ward line WL), a third semiconductor layer D3 disposed on a side of the third electrode EL3 (on a side of the bit line BL), and a second conductive layer D2 disposed between the first semiconductor layer D1 and the third conductive layer D3. For example, the first semiconductor layer D1 is an n-type semiconductor layer ($n^+$ layer) having high impurity concentration, the second conductive layer D2 is an n-type semiconductor layer ($n^-$ layer) having lower impurity concentration than the first semiconductor layer D1, the third semiconductor layer D3 is a p-type semiconductor layer ($p^+$ layer) having high impurity concentration. As described above, in the example, a p-n junction diode is used as the rectifying device DI, and any other configuration, such as Schottky diode, may be applied to the rectifying device DI.

As described above, the memory cell MC includes the resistance change layer VR and the rectifying device DI that are mutually connected in series. Note that, in the example, the resistance change layer VR is provided on a side of the ward line WL, and the rectifying device DI is provided on a side of the bit line BL. However, the resistance change layer VR may be provided on the side of the bit line BL, and the rectifying device DI may be provided on the side of the ward line WL. Also, in the example, the first semiconductor layer D1 is disposed on a side of the ward line WL, and the third semiconductor layer D3 is disposed on a side of the bit line BL. However, the third semiconductor layer D3 may be disposed on the side of the ward line WL, and the first semiconductor layer D1 may be disposed on the side of the bit line BL. Hereinafter, the case will be described, in which the first semiconductor layer D1 is disposed on the side of the ward line WL, and the third semiconductor layer D3 is disposed on the side of the bit line BL.

W, WN, TaN, TaSiN, $TaSi_2$, TiN, TiC, TaC, Nb—$TiO_2$, and the like can be used for the second electrode EL2, for example, considering a work function thereof.

Pt, Au, Ag, TiAlN, SrRuO, Ru, RuN, Ir, Co, Ti, TiN, TaN, LaNiO, Si, Al, $PtIrO_x$, $PtRhO_x$, W, Rh/TaAlN, and the like can be used for the first electrode EL1 and the third electrode EL3, for example. Further, a material used for the second electrode EL2 may be the same as the material used for the first electrode EL1 and the third electrode EL3.

The memory cell MC may further include a buffer layer, a barrier metal layer, and an adhesive layer, and the like, other than the constituents described above.

Note that, the first to third electrodes EL1 to EL3 in the above description can be provided as necessary, and may be omitted in some cases.

In the resistance change layer VR, at least one of current energy, thermal energy, and chemical energy may change a resistance value of the resistance change layer VR according to an applied voltage, for example. That is, the resistance change layer VR includes a first state (high-resistance state) having a first resistance value and a second state (low-resistance state) having a second resistance value that is lower than the first resistance value. Herein after, transferring from the first state (high-resistance state) to the second state (low-resistance state) is referred to as a set operation, and transferring from the second state (low-resistance state) to the first state (high-resistance state) is referred to as a reset operation.

A configuration example of the resistance change layer VR will be described below.

An interlayer insulating film omitted in FIGS. 3 and 4 is provided between the components described above, such as between the bit lines BL, between the ward lines WL, and between the memory cells MC.

As shown in FIG. 2, the control unit CU is connected to the first interconnection WR1 and to the second interconnection WR2. The control unit CU controls a voltage applied to the first interconnection WR1 and to the second interconnection WR2, and supplies at least one of a voltage and a current to the resistance change layer VR for changing the resistance thereof.

Then, in the non-volatile memory device 110 according to the embodiment, when applying a set voltage to the first interconnection WR1 in the set operation, the control unit CU increases an upper limit value of a current supplied to the first interconnection WR1 based on a change of an electric potential of the first interconnection. As described above, in the set operation, the resistance change layer VR is transited from the first state having the first resistance value to the second state having the second resistance value that is lower than the first resistance value.

Note that, although the first interconnection WR1 may be a ward line WL, as already described, the case in which the first interconnection WR1 is the bit line BL will be hereinafter described. That is, the control unit CU increases an upper limit value of a current to be supplied to the bit line BL based on a change of an electrical potential of the bit line BL, when applying a set voltage to the bit line BL in the set operation.

Hereinafter, an example of a configuration of the memory cell MC in a non-volatile memory device will be described. As shown in FIG. 1, the non-volatile memory device 110 (memory cell 1) according to the embodiment includes the first conductive layer 10 (for example, the first electrode EL1), the second conductive layer 20 (the second electrode EL2), and the resistance change layer 30 (VR).

The resistance change layer 30 is provided between the first conductive layer 10 and the second conductive layer 20. The resistance change layer 30 includes an oxide that contains at least one of hafnium (Hf) and zirconium (Zr), at least one selected from the group consisting of barium (Ba), lanthanum (La), gadolinium (Gd), and lutetium (Lu), and nitrogen (N).

For example, the oxide contained in the resistance change layer 30 has a metal site containing a hafnium atom and a metal site containing a barium atom. Also, the oxide has oxygen sites containing oxygen atoms and nitrogen atoms.

For example, a ratio of hafnium to barium (Hf:Ba) may be 3:1. The ratio is preferably in a range of 2:1 to 6:1. Also, a ratio of oxygen and nitrogen (O:N) is, for example, 8:1, and the ratio is preferably in a range of 8:2 to 8:0.5.

A ratio of elements, such as barium and nitrogen, can be, for example, measured using a secondary ion mass spectroscopy (SIMS), an X-ray photoelectron spectroscopy (XPS) using angle resolution, and the like. Alternatively, an atom probe method may be used.

The thickness of the resistance change layer 30 in a direction from the first conductive layer 10 to the second conductive layer 20 is, for example, 2 to 3 nanometers (nm).

Zirconium can be used in place of hafnium for the oxide contained in the resistance change layer 30. Alternatively, the oxide may include hafnium, zirconium, and barium.

Further, the oxide may include one of lanthanum (La), gadolinium (Gd) and lutetium (Lu) in place of barium. The oxide may include a plurality of metal elements selected from the group consisting of lanthanum (La), gadolinium (Gd), lutetium (Lu), and barium. The oxide formed by oxidizing one of these metal elements has a higher dielectric constant than a dielectric constant of hafnium oxide ($HfO_2$) or zirconium oxide ($ZrO_2$).

Titanium nitride (TiN) may be used for the first conductive layer 10 and for the second conductive layer 20, for example.

In a manufacturing process of such a memory cell 1, TiN is deposited on a substrate (not illustrated) using a sputtering method, for example. Next, an oxide is deposited on a TiN film using an atomic layer deposition (ALD) method, for example. Further, a TiN film is formed on the oxide again. Then, the stack structure of TiN/oxide/TiN is processed into a predetermined pattern using photolithography to form the memory cell 1. The width of the memory cell 1 is, for example, 10 to 30 nm.

FIGS. 5A to 5D are schematic cross-sectional views illustrating variations of the non-volatile memory device according to the first embodiment.

Figure 5A:
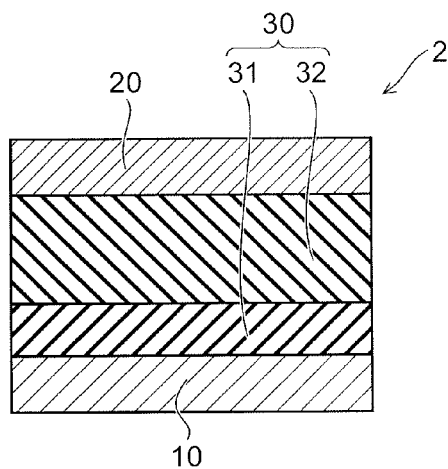
FIGS. 5A to 5D are schematic cross-sectional views illustrating variations of the non-volatile memory device according to the first embodiment.

In a memory cell 2 shown in FIG. 5A, the resistance change layer 30 includes a first part 31 and a second part 32. In this example, the second part 32 is provided between the second conductive layer 20 and the first part 31. Also, the ratio of barium contained in the first part is higher than the ratio of barium contained in the second part. Meanwhile, nitrogen atoms are distributed more uniformly in the resistance change layer 30 than barium atoms.

That is, a value obtained by dividing an absolute difference between a nitrogen concentration in the first part 31 and a nitrogen concentration in the second part 32 by the lower nitrogen concentration of the nitrogen concentration in the first part 31 and the nitrogen concentration in the second part 32 is smaller than a value obtained by dividing an absolute difference between a barium concentration in the first part 31 and a barium concentration in the second part 32 by the lower barium concentration between the barium concentration in the first part 31 and the barium concentration in the second part 32.

Further, the thickness of the second part 32 in a direction from the first conductive layer 10 to the second conductive layer 20 is larger than that of the first part 31. The thickness of the first part may be approximately a lattice spacing of unit lattice (0.5 nm) in hafnium oxide.

Figure 5B:
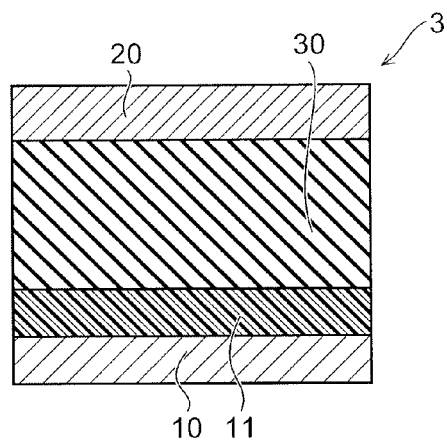

In a memory cell 3 shown in FIG. 5B, the first conductive layer 10 contains silicon. That is, the first conductive layer 10 may be a single crystal silicon layer or a polycrystal silicon layer (polysilicon layer). In this case, an intermediate layer 11 may be provided between the first conductive layer 10 and the resistance change layer 30. The intermediate layer 11 is, for example, a silicon oxide film or a silicon oxynitride film. That is, oxidizing or nitridizing the first conductive layer 10 forms the intermediate layer 11 in a process of forming the resistance change layer 30.

Figure 5C:
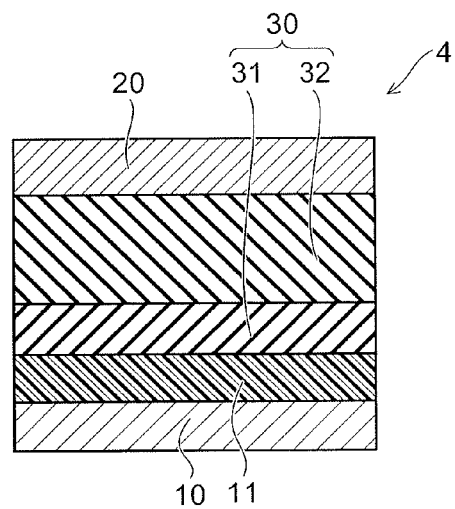

In a memory cell 4 shown in FIG. 5C, the resistance change layer 30 includes the first part 31 and the second part 32. Further, the first conductive layer 10 contains silicon, and the intermediate layer 11 is provided between the first conductive layer 10 and the resistance change layer 30.

Figure 5D:
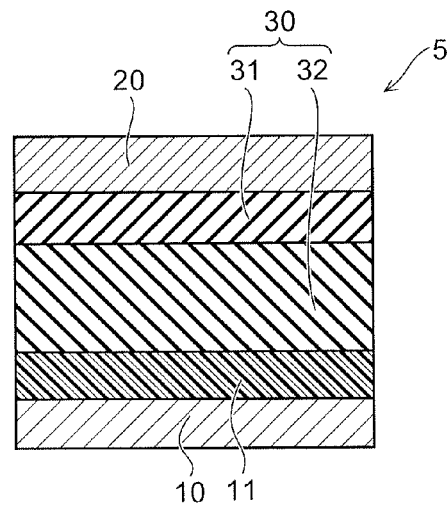

In a memory cell 5 shown in FIG. 5D, the second part 32 is provided in a vicinity of the first conductive layer 10, and the first part 31 is provided between the second part 32 and the second conductive, layer 20. That is, the first part containing a high ratio of barium is desirably positioned in the vicinity of either the first conductive layer 10 or the second conductive layer 20.

Figure 6A:
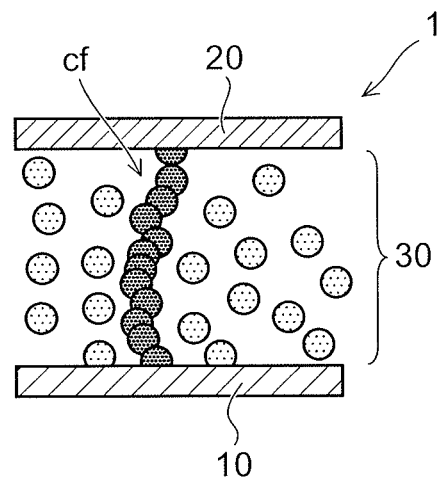
FIGS. 6A and 6B are schematic views illustrating a low resistance state and a high resistance state of the non-volatile memory device according to the first embodiment.
Figure 6B:
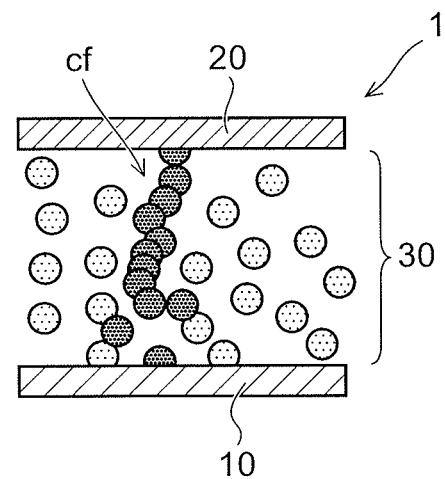

FIGS. 6A and 6B are schematic views illustrating the operating states of the non-volatile memory device according to the first embodiment.

FIG. 6A is a schematic cross sectional view showing the memory cell 1 in the low-resistance state (set state). FIG. 6B is a schematic cross sectional view showing the memory cell 1 in the high-resistance state (reset state).

In the memory cell 1, a current path so called a filament cf is formed in the resistance change layer 30 by applying a predetermined voltage between the first conductive layer 10 and the second conductive layer 20. For example, oxygen atoms in the resistance change layer 30 are moved by the application of the voltage, and oxygen defects continuously lining between the first conductive layer 10 and the second conductive layer 20 forms the filament cf. Consequently, the resistance change layer 30 enters the low-resistance state in which a predetermined current may flow between the first conductive layer 10 and the second conductive layer 20.

Subsequently, a reset voltage is applied between the first conductive layer 10 and the second conductive layer 20. The applied voltage removes the oxygen atoms, and cuts a part of the filament cf. That is, the resistance change layer 30 is transited to the high-resistance state in which the current flowing is suppressed between the first conductive layer 10 and the second conductive layer 20.

Further, applying a set voltage again between the first conductive layer 10 and the second conductive layer 20 may reproduces the filament cf, repairing the discontinued part, and the resistance change layer 30 is transited to the low-resistance state. Repeating such a process executes writing/deleting of information to/from the memory cell 1.

FIGS. 7A to 7D are schematic views illustrating characteristics of a non-volatile memory device.

Figure 7A:
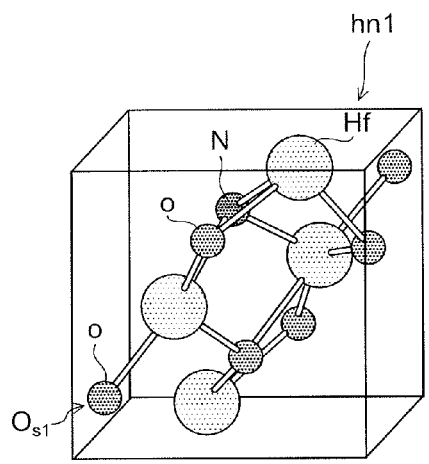
FIGS. 7A to 10D are schematic views illustrating characteristics of the non-volatile memory device according to the first embodiment.
Figure 7B:
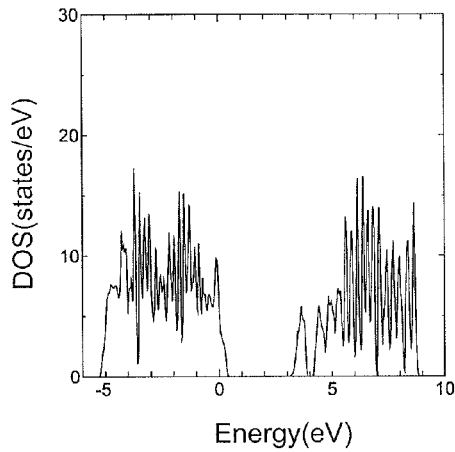
Figure 7C:
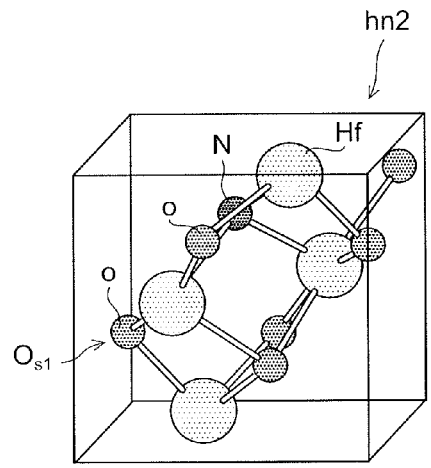
Figure 7D:
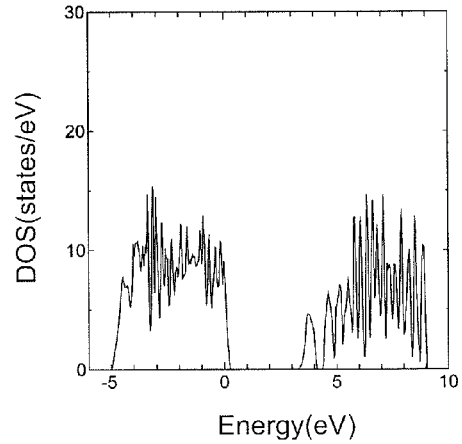

These drawings show characteristics of an oxide hn in which parts of the oxygen sites in hafnium oxide are replaced with nitrogen atoms, and oxygen defects are provided. FIGS. 7A and 7C schematically show unit cells in which one of oxygen atoms is replaced with a nitrogen atom, respectively. FIG. 7B shows an energy band diagram corresponding to the unit cell in FIG. 7A. FIG. 7D shows an energy band diagram corresponding to the unit cell in FIG. 7C. The horizontal axis represents energy (eV) and the vertical axis represents density of state (DOS) in both drawings. Here, the energy band is an example corresponding to the unit cells in the schematic views. The energy values may shift from an experimentally measured value by approximately 1 eV or −1 eV.

FIGS. 7A and 7C show two stable states hn1 and hn2, in which a position of the oxygen atom denoted by $O_{S1}$ is different from each other.

FIGS. 8A to 8D are schematic views illustrating characteristics of the non-volatile memory device.

Figure 8A:
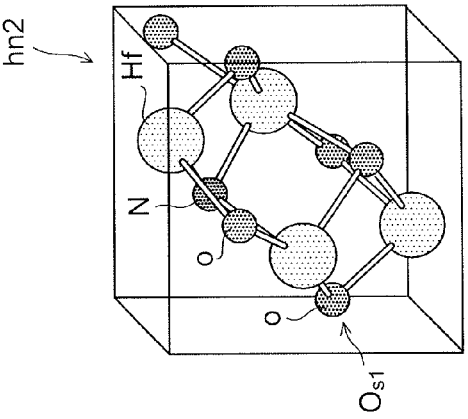
Figure 8B:
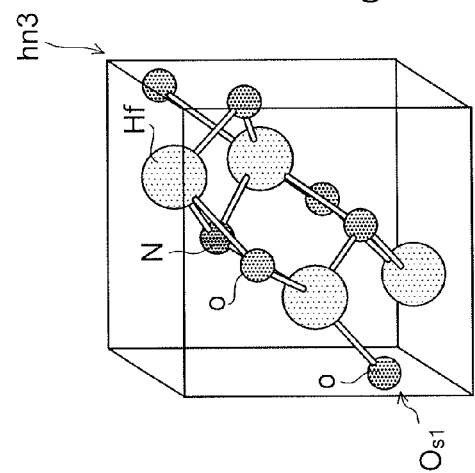
Figure 8C:
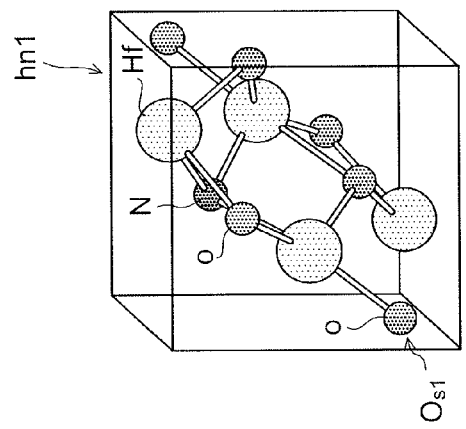

FIGS. 8A, 8B, and 8C respectively show crystal structures hn1, hn3, and hn2 corresponding to three states of the oxide hn.

FIGS. 8A and 8C show the unite cells of the oxide hn corresponding to the two stable states hn1 and hn2 respectively.

FIG. 8B shows a structure corresponding to an intermediate state hn3 when transiting from hn1 to hn2. That is, the oxide hn can make a transition of hn1→hn3→hn2 or hn2→hn3→hn1 by oxygen diffusion.

Figure 8D:
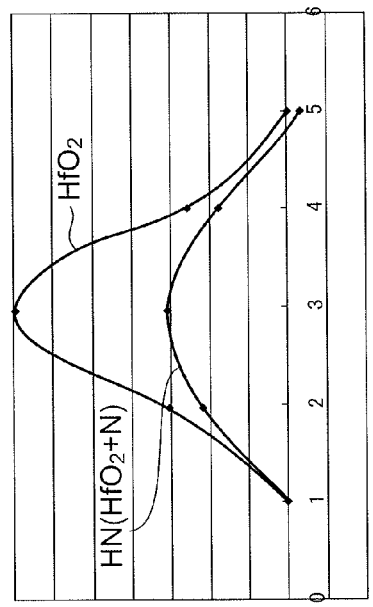

FIG. 8D is a graph showing energy change $E_A$ associated with the transition of the oxide hn and transition of a crystal structure in hafnium oxide. Reaction coordinates 1 corresponds to hn1; reaction coordinates 3 corresponds to hn3; and reaction coordinates 5 corresponds to hn2, in the horizontal axis, respectively. Further, as shown in FIG. 8D, $E_A$ in the intermediate state hn3 is interpreted as activation energy of the oxygen diffusion. Compared with the $E_A$ value of the intermediate state in hafnium oxide, the activation energy of the oxide hn is reduced to approximately 40%.

FIGS. 9A to 9D are schematic views illustrating characteristics of a non-volatile memory device.

Figure 9A:
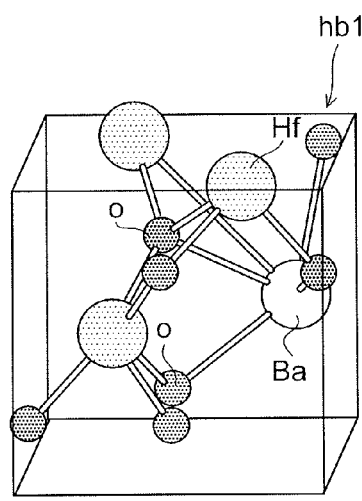
Figure 9B:
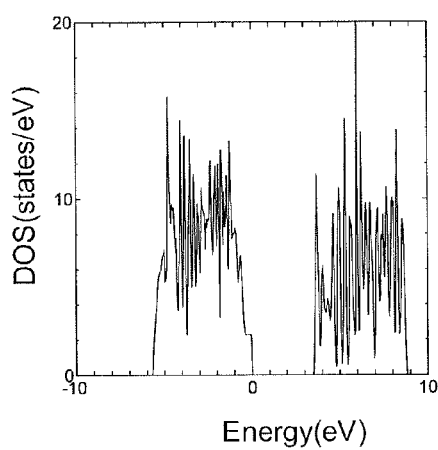
Figure 9C:
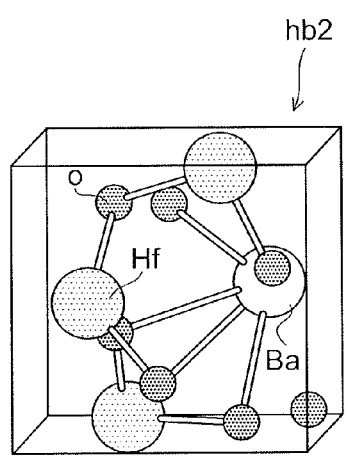
Figure 9D:
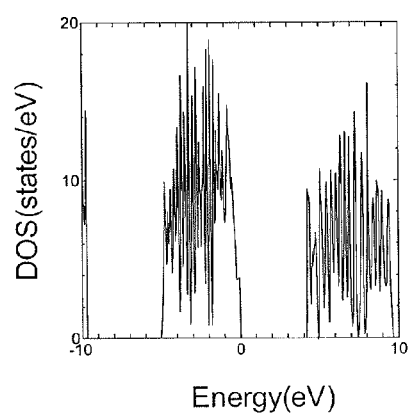

These drawings show characteristics of an oxide hb in which parts of the metal sites of hafnium oxide are replaced with barium atoms and oxygen defects are provided. FIGS. 9A and 9C schematically show unit cells in which one hafnium atom is replaced with a barium atom. FIG. 9B is an energy band diagram corresponding to the unit cell shown in FIG. 9A. FIG. 9D is an energy band diagram corresponding to the unit cell shown in FIG. 9C. The horizontal axis represents energy (eV), and the vertical axis represents density of state DOS.

FIGS. 9A and 9C show two stable states hb1 and hb2. As shown in FIGS. 9B and 9D respectively, the oxide hb is insulator having band gaps of 3.5 eV in hb1 and 4 eV in hb2.

Figure 10A:
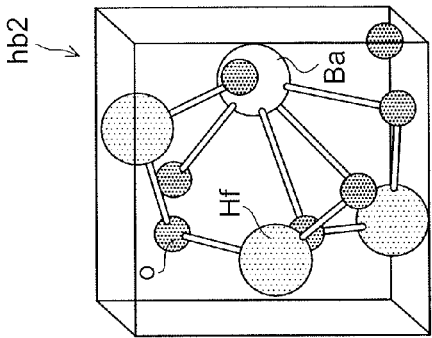
Figure 10B:
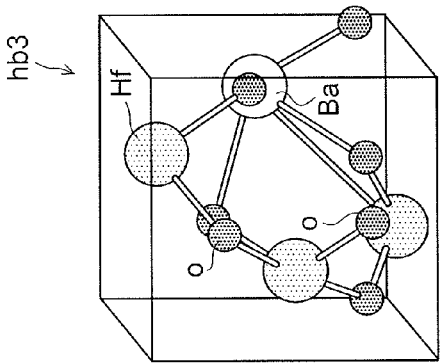
Figure 10C:
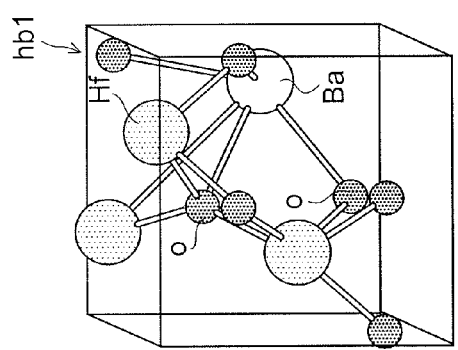

FIGS. 10A to 10D are schematic views illustrating characteristics of the non-volatile memory device. FIGS. 10A, 10B, and 10C respectively show crystal structures hb1, hb3, and hb2 corresponding to three states of the oxide hb. FIGS. 10A and 10C shows the unit cells of the oxide hb corresponding to the two stable states hb1 and hb2 respectively.

FIG. 10B shows a structure corresponding to an intermediate state hb3 when transiting from hb1 to hb2. That is, the oxide hb can make a transition of hb1→hb3→hb2 or hb2→hb3→hb1.

Figure 10D:
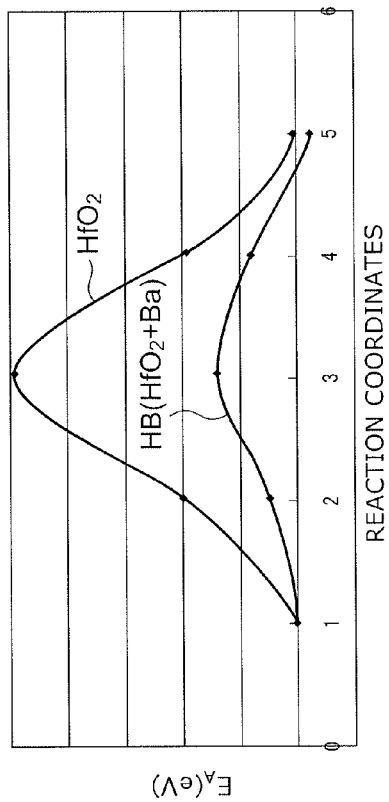

FIG. 10D is a graph showing energy change $E_A$ associated with the transition of the oxide hb and transition of the crystal structure in hafnium oxide. Reaction coordinates 1 corresponds to hb1; reaction coordinates 3 corresponds to hb3; reaction coordinates 5 correspond to hb2, in the horizontal axis, respectively. Also, as shown FIG. 10D, $E_A$ in the intermediate state hb3 is interpreted as the activation energy of the oxygen diffusion. Compared with the $E_A$ value of the intermediate state in hafnium oxide, the activation energy of the oxide hb is reduced to approximately 30%.

Such a non-volatile memory device shown in the embodiment may include a process of forming a filament cf by applying a voltage to a memory cell in an initial state, in which no filament cf is formed. Since the metal oxide used for the resistance change layer 30 is an insulator, an initial forming voltage is high. Here, the forming voltage is the one for forming the filament cf. Meanwhile, to reliably form the filament cf in each of memory cells disposed in the large scale memory unit, the forming voltage is preferably to be low.

As described above, the activation energy of the oxygen diffusion can be reduced by replacing parts of the oxygen sites in the hafnium oxide with nitrogen atoms, or by replacing parts of the metal sites with barium atoms. Alternatively, parts of the oxygen sites may be replaced with nitrogen atoms, and further, parts of the metal sites may be replaced with barium atoms. Consequently, the movement of the oxygen in the oxide becomes easy, and the forming voltage may be reduced.

Further, the dielectric constant of barium oxide is about 34, and the dielectric constant of hafnium oxide is larger than 25. That is, a micro area in which hafnium is replaced with barium has a higher dielectric constant, and electric field in the area becomes higher than that in a surrounding area thereof. That is, the movement of oxygen becomes easier.

Meanwhile, the discontinuity of the filament cf as shown in FIG. 6B occurs in the vicinity of the first conductive layer 10 or of the second conductive layer 20. That is, the transition between the low-resistance state and the high-resistance state is caused by making and repairing the discontinuity of the filament cf in the vicinity of the first conductive layer 10 or of the second conductive layer 20. Therefore, by providing the first part 31 having the higher barium ratio in the vicinity of the first conductive layer 10 or the second conductive layer 20, it may be possible to make the set and the reset operations easier, and a time period thereof may also be reduced in the memory cell.

The above-described effect may also be obtained in the resistance change layer, in which hafnium is replaced with zirconium. Alternatively, an oxide including hafnium oxide and zirconium oxide may be used for the resistance change layer. Further, the activation energy of the oxygen diffusion may be reduced using any one of lanthanum, gadolinium, and lutetium in place of barium. The resistance change film may contain a plurality of elements selected from the group consisting of barium, lanthanum, gadolinium, and lutetium.

<Second Embodiment>

Figure 11:
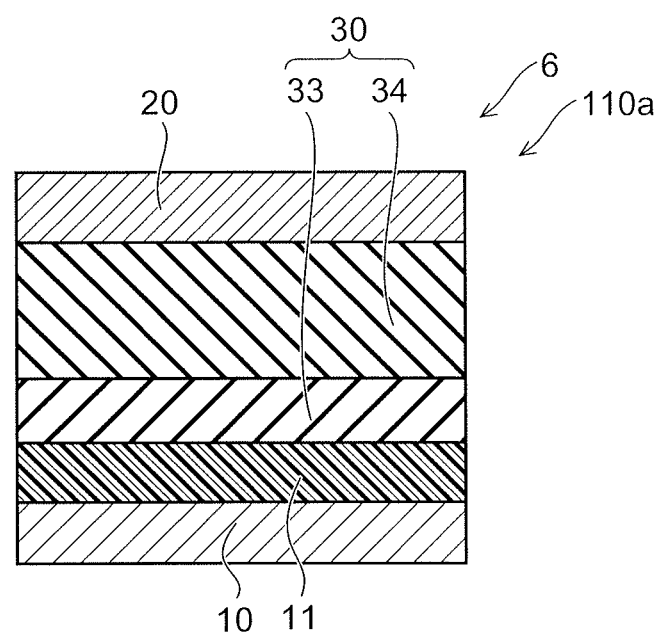
FIG. 11 is a schematic cross-sectional view illustrating a non-volatile memory device according to a second embodiment.

FIG. 11 is a schematic cross sectional view illustrating a non-volatile memory device according to a second embodiment.

In a non-volatile memory device 110a according to the embodiment, a memory cell 6 includes a first conductive layer 10, a second conductive layer 20, a resistance change layer 30, and an intermediate layer 11.

The resistance change layer 30 includes oxide containing hafnium, barium, nitrogen, and fluorine. For example, the oxide included in the resistance change layer 30 has metal sites containing hafnium and barium. Also, oxygen sites contain oxygen, nitrogen, and fluorine.

For example, a ratio of hafnium atoms to barium atoms (Hf:Ba) may be 3:1. The ratio is preferably in a range of 2:1 to 6:1. Also, a ratio of oxygen to nitrogen (O:N) is, for example, 8:1, and the ratio is preferably in a range of 8:2 to 8:0.5. A ratio of oxygen to fluorine (O:F) is, for example, 8:1, and the ratio is preferably in a range of 8:2 to 8:0.5.

Further, the resistance change layer 30 includes a first part 33 and a second part 34. In this example, the second part 34 is provided between the second conductive layer 20 and the first part 33. Further, the ratio of barium atoms contained in the first part 33 is higher than that contained in the second part 34. Further, the ratio of fluorine atoms contained in the first part 33 is higher than that contained in the second part 34. Meanwhile, the nitrogen atoms are distributed more uniformly in the resistance change layer 30 than the barium atoms and fluorine atoms.

In a direction from the first conductive layer 10 to the second conductive layer 20, the thickness of the second part 34 is larger than that of the first part 33. The thickness of the first part 33 may be, for example, approximately a lattice spacing of a unit lattice (0.5 nm) in hafnium oxide. Also, the first part 33 may be provided in the vicinity of the second conductive layer 20. That is, the first part 33 may be provided between the second part 34 and the second conductive layer 20.

FIGS. 12A to 12D are schematic views illustrating characteristics of a non-volatile memory device according to the second embodiment.

Figure 12A:
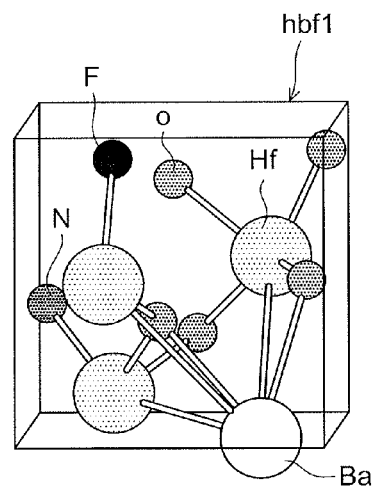

These drawings show characteristics of an oxide hbf in which parts of the metal sites of hafnium oxide are replaced with barium atoms, parts of the oxygen sites are replaced with nitrogen atoms and fluorine atoms, and oxygen defects are provided. FIGS. 12A and 12C schematically show unit cells of the oxide hbf, in which one hafnium atom is replaced with one barium atom and two oxygen atoms are replaced with a nitrogen atom and a fluorine atom, respectively.

Figure 12B:
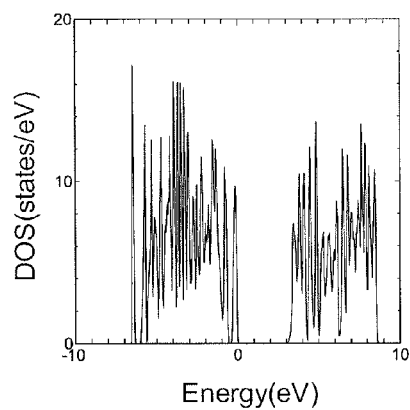
Figure 12C:
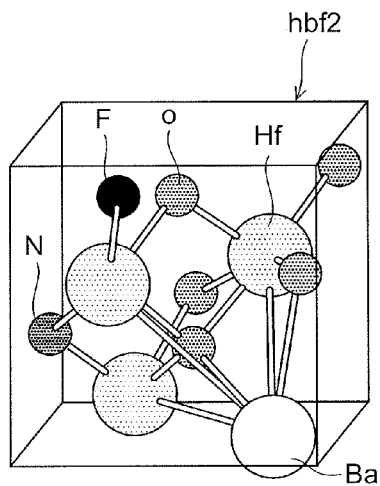

FIG. 12B is an energy band diagram corresponding to the unit cell shown in FIG. 12A.

Figure 12D:
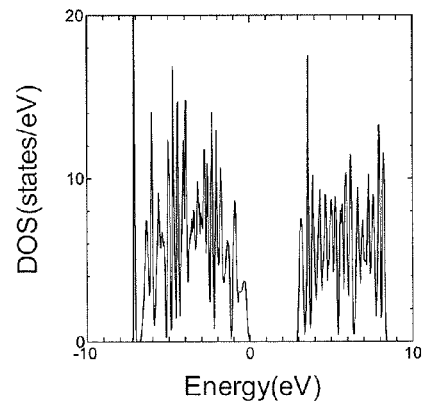

FIG. 12D is an energy band diagram corresponding to the unit cell shown in FIG. 12C. The horizontal axis represents energy (eV), and the vertical axis represents density of state DOS.

FIGS. 12A and 12C show two stable states hbf1 and hbf2.

As shown in FIGS. 12B and 12D, the oxide hbf is an insulator having a band gap of about 3 eV.

FIGS. 13A to 13F are schematic views illustrating characteristics of the non-volatile memory device according to the second embodiment.

These drawings respectively show crystal structures hbf1 to hbf5 corresponding to five states of the oxide hbf. FIGS. 13A and 13E show the unite cells of the oxide hbf corresponding to the two stable states hbf1 and hbf2 respectively.

FIGS. 13B to 13D show structures corresponding to the intermediate states hbf3 to hbf5 when transiting from hbf1 to hbf2. That is, the oxide hbf is capable of making a transition of hbf1→hbf3→hbf4→hbf5→hbf2 or hbf2→hbf5→hbf4→hbf3→hbf1. During the transition, the oxygen atom $O_{S2}$ moves as shown in the drawings, for example.

FIG. 13F is a graph showing energy change associated with the transition of the oxide hbf and transition of a crystal structure in hafnium oxide. Reaction coordinates 1 corresponds to hbf1; reaction coordinates 2 corresponds to hbf3; reaction coordinates 3 corresponds to hbf4; reaction coordinates 4 corresponds to hbf5; and reaction coordinates 5 correspond to hbf2, in the horizontal axis, respectively. Then, as shown in FIG. 13F, $E_A$ in the intermediate state hbf4 (reaction coordinates 3) is interpreted as the activation energy of oxygen diffusion. Compared with the $E_A$ value of the intermediate state in hafnium oxide, the activation energy of the oxide hbf is approximately tripled.

FIGS. 14A to 14D are schematic views illustrating characteristics of a non-volatile memory device. These drawings show characteristics of an oxide hf in which parts of the oxygen sites in hafnium oxide is replaced with fluorine atoms, and oxygen defects are provided.

Figure 14A:
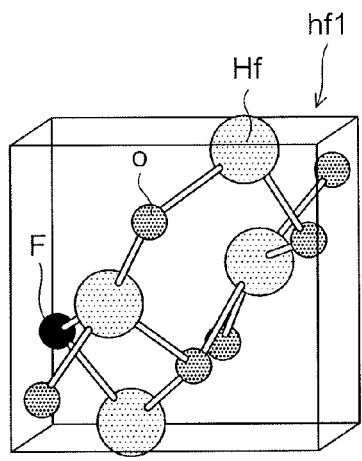
Figure 14B:
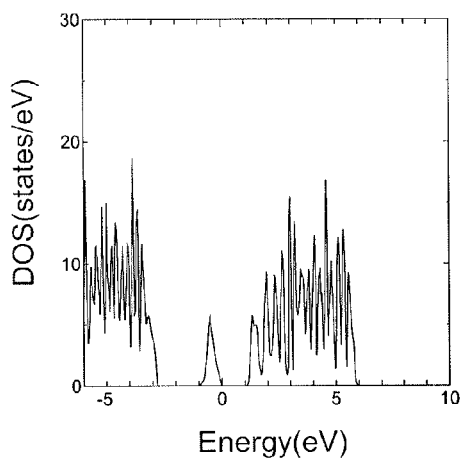
Figure 14C:
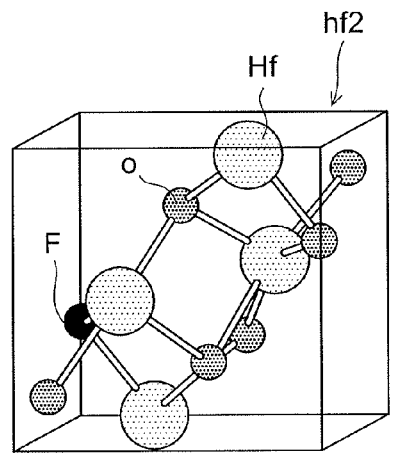

FIGS. 14A and 14C schematically show unit cells of the oxide hf. In this case, one oxygen atom is replaced with a fluorine atom.

FIG. 14B is an energy band diagram corresponding to the unit cell shown in FIG. 14A.

Figure 14D:
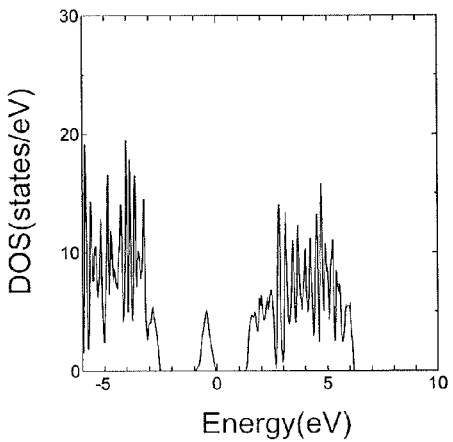

FIG. 14D is an energy band diagram corresponding to the unit cell shown in FIG. 14C. The horizontal axis represents energy (eV) and the vertical axis represents density of state DOS.

FIGS. 14A and 14C show two stable states hf1 and hf2.

As shown in FIGS. 14B and 14D, the oxide hf is an insulator having a band gap of approximately 1 eV.

FIGS. 15A to 15C are schematic views illustrating characteristics of the non-volatile memory device. These drawings respectively show crystal structures hf1, hf3, and hf2 corresponding to three states of the oxide hf. FIGS. 15A and 15C show the unite cells of the oxide hf corresponding to the stable states hf1 and hf2 respectively.

FIG. 15B shows a structure corresponding to the intermediate state hf3 when transiting from hf1 to hf2. That is, the oxide hf is capable of making a transition of hf1→hf3→hf2 or hf2→hf3→hf1 by the oxygen diffusion.

FIG. 15D is a graph showing energy change associated with the transition of the oxide hf and a transition of a crystal structure in hafnium oxide. Reaction coordinates 1 corresponds to hf1; reaction coordinates 3 corresponds to hf3; and reaction coordinates 5 corresponds to hf2, in the horizontal axis, respectively. Further, as shown in FIG. 15D, $E_A$ in the intermediate state hf3 is interpreted as the activation energy of oxygen diffusion. Compared with the $E_A$ value of the intermediate state in hafnium oxide, the activation energy in the oxide hf is approximately 1.5 times.

By replacing parts of the oxygen sites in hafnium oxide with fluorine atoms in this way, the activation energy of oxygen diffusion is increased and it becomes difficult for the oxygen atom to move in the oxide. Also, as shown in FIG. 13F, by replacing parts of the metal sites with barium atoms, and further, by replacing oxygen sites with nitrogen atoms and fluorine atoms, the activation energy is further increased and becomes about double the case in which oxygen atom is replaced with fluorine atom shown in FIG. 15D.

The activation energy of oxygen diffusion may increase this way, suppressing the movement of an oxygen atom. Therefore, for example, the low-resistance state (set state) may be maintained for a longer period, and thereby storage characteristic may be improved.

Meanwhile, since replacing parts of the oxygen sites with fluorine atoms increases the activation energy of oxygen, the forming voltage and the set voltage become higher. Therefore, it is preferable to replace fluorine in a portion that contributes to set/reset, instead of uniformly replacing fluorine throughout the resistance change layer 30. That is, by making the ratio of fluorine in the first part 33 larger, the storage characteristic may be improved, suppressing the increase in the forming voltage and the set voltage.

Further, in the first part in which the ratio of fluorine is made larger, parts of hafnium atoms are replaced with barium atoms. Therefore, the dielectric constant in that portion becomes higher, and the electric field intensity may become higher. As a result, it becomes possible to suppress the increase in the forming voltage and the set voltage, and to reduce the time period between set and reset operations.

<Third Embodiment>

Figure 16:
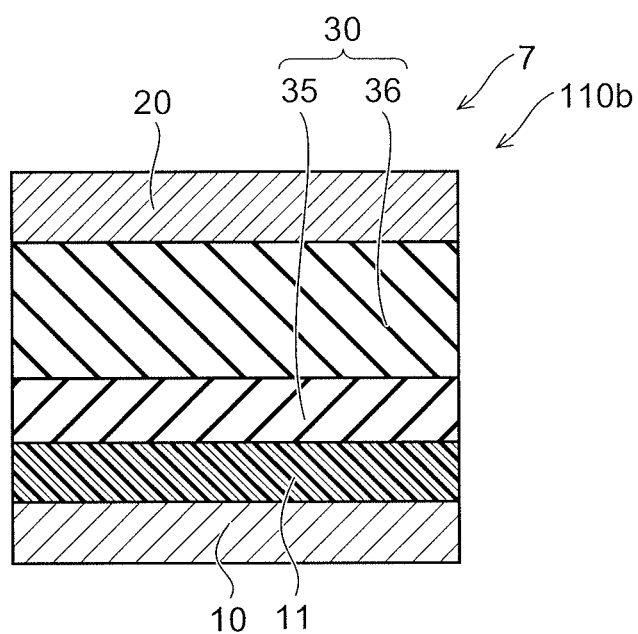
FIG. 16 is a schematic cross sectional view illustrating a non-volatile memory device according to a third embodiment.

FIG. 16 is schematic cross sectional view illustrating a configuration of a non-volatile memory device according to a third embodiment.

As shown in FIG. 16, in a non-volatile memory device 110b according to the embodiment, a memory cell 7 includes a first conductive layer 10, a second conductive layer 20, a resistance change layer 30, and an intermediate layer 11.

The resistance change layer 30 includes an oxide containing hafnium (Hf), lanthanum (La), nitrogen (N), and fluorine (F). Further, the oxide contains hafnium and lanthanum in metal site. Further, oxygen site oxygen contains nitrogen, and fluorine.

For example, a ratio of hafnium atoms to lanthanum atoms (Hf:La) may be 3:1. The ratio is preferably in a range of 2:1 to 6:1. Also, a ratio of oxygen atoms to nitrogen atoms (O:N) is, for example, 8:1, and the ratio is preferably in a range of 8:2 to 8:0.5. A ratio of oxygen to fluorine (O:F) is, for example, 8:1, and the ratio is preferably in a range of 8:2 to 8:0.5.

Further, the resistance change layer 30 includes a first part 35 and a second part 36. In this example, the second part 36 is provided between the second conductive layer 20 and the first part 35. Further, a ratio of lanthanum atoms contained in the first part 35 is higher than that contained in the second part 36. Further, a ratio of fluorine atoms contained in the first part 35 is higher than that contained in the second part 36. Meanwhile, nitrogen atoms are distributed more uniformly in the resistance change layer 30 than the lanthanum atoms and the fluorine atoms. A ratio of oxygen atoms to fluorine atoms (O:F) contained in the first part is, for example, 8:1, and the ratio is preferably in a range of 8:2 to 8:0.5.

The thickness of the second part 36 in a direction from the first conductive layer 10 to the second conductive layer 20 is larger than that of the first part 35. The thickness of the first part 35 may be, for example, approximately a lattice spacing of a unit lattice (0.5 nm) in hafnium oxide. Also, the first part 35 may be provided in the vicinity of the second conductive layer 20. That is, the first part 35 may be provided between the second part 36 and the second conductive layer 20.

FIGS. 17A to 17D are schematic views illustrating characteristics of the non-volatile memory device according to the third embodiment.

These drawings show characteristics of an oxide hl in which parts of metal sites in hafnium oxide are replaced with lanthanum atoms, and parts of oxygen sites are replaced with nitrogen atoms and fluorine atoms, and oxygen defects are provided.

Figure 17A:
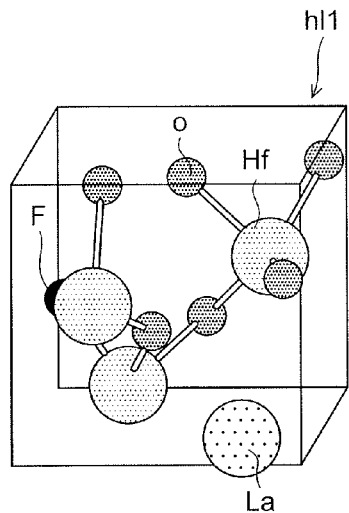
Figure 17B:
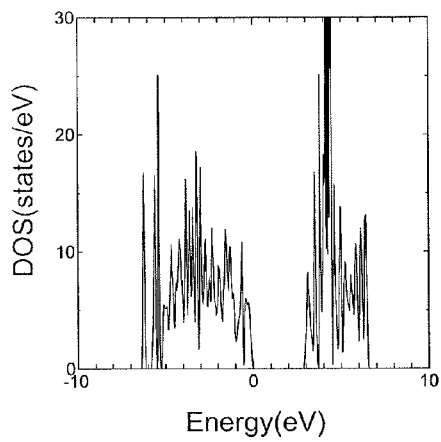
Figure 17C:
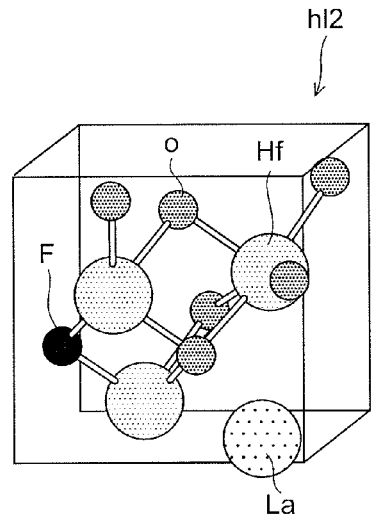

FIGS. 17A and 17C schematically show unit cells in which one hafnium atom is replaced with a lanthanum atom and two oxygen atoms are replaced with a nitrogen atom and a fluorine atom, respectively.

FIG. 17B is an energy band diagram corresponding to the unit cell shown in FIG. 17A.

Figure 17D:
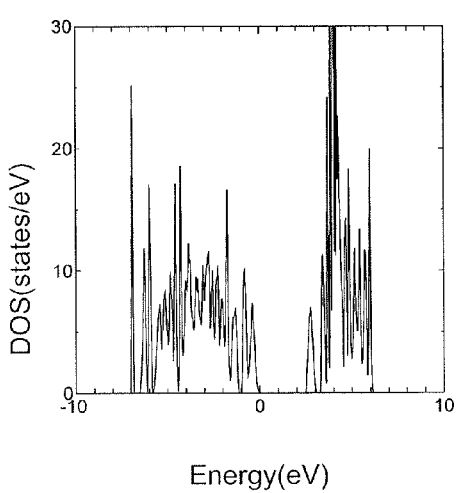

FIG. 17D is an energy band diagram corresponding to the unit cell shown FIG. in 17C. The horizontal axis represents energy (eV) and the vertical axis represents density of state DOS.

FIGS. 17A and 17C show two stable states hl1 and hl2.

As shown in FIGS. 17B and 17D, the oxide hl is an insulator having band gaps of about 3 eV in hl1 and 2.5 eV in hl2.

FIGS. 18A and 18F are schematic views illustrating characteristics of the non-volatile memory device according to the third embodiment.

These drawings respectively show crystal structures hl1 to hl5 corresponding to five states of the oxide hl. FIGS. 18A and 18E show the unit cells corresponding to the two stable states hl1 and hl2 respectively.

FIGS. 18B to 18D show structures corresponding to the intermediate states hl3 to hl5 when transiting from hl1 to hl2. That is, the oxide hl is capable of making a transition of hl1→hl3→hl4→hl5→hl2 or hl2→hl5→hl4→hl3→hl1. During the transition, the oxygen atom $O_{S3}$ moves in the unit cell as shown in the drawings.

FIG. 18F is a graph showing energy change associated with the transition of the oxide hl, and a transition of a crystal structure in hafnium oxide. Reaction coordinates 1 corresponds to hl1; reaction coordinates 2 corresponds to hl3; reaction coordinates 3 corresponds to hl4; reaction coordinates 4 corresponds to hl5; and reaction coordinates 5 correspond to hl2, in the horizontal axis, respectively. Further, as shown in FIG. 18F, $E_A$ in the intermediate state hl4 (reaction coordinates 3) is interpreted as the activation energy of oxygen diffusion. Further, compared with the $E_A$ value of the intermediate state in hafnium oxide, the activation energy in the oxide hl is approximately tripled.

Even in a case of replacing parts of hafnium atoms with lanthanum atoms in this way, replacing parts of oxygen atoms with fluorine atoms may increases the activation energy of oxygen diffusion. Further, the storage characteristic can be improved while suppressing an increase in the forming voltage and the set voltage.

Further, similar effects can be realized even using gadolinium (Gd) and lutetium (Lu) other than lanthanum. Alternatively, hafnium may be replaced using two or more metal elements selected from the group consisting of barium, lanthanum, gadolinium, and lutetium.

Note that the drawings of FIGS. 7 to 18 used in the above description are obtained as a result of simulation conducted by the inventors.

<Fourth Embodiment>

Figure 19:
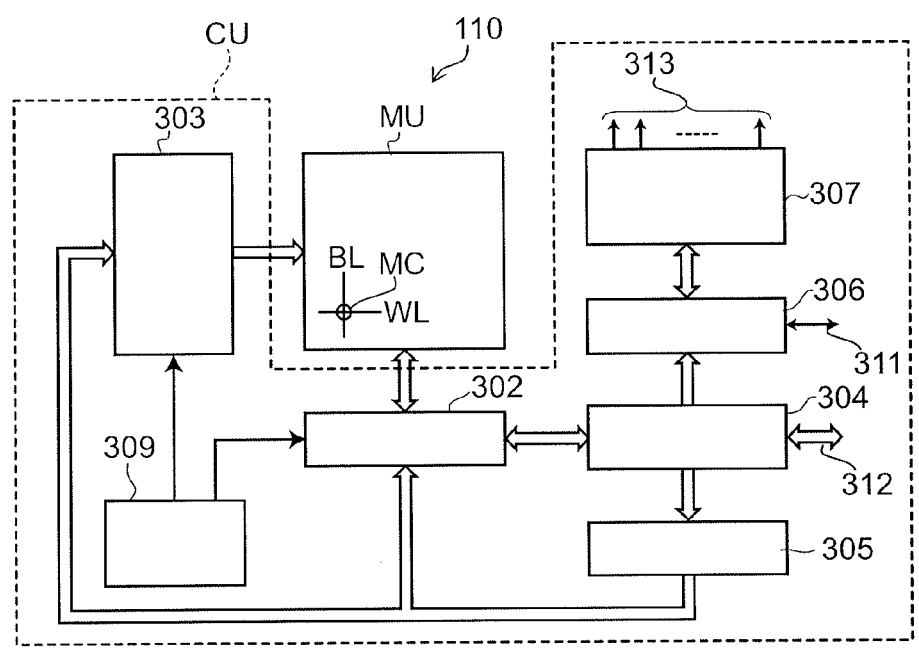
FIG. 19 is a block diagram illustrating a non-volatile memory device according to a fourth embodiment.

FIG. 19 is a block diagram illustrating a configuration of a non-volatile memory device according to a fourth embodiment.

As shown in FIG. 19, a non-volatile memory device 110 is provided with a memory unit MU and a control unit CU.

As already described above, the memory unit MU may include a plurality of bit lines BL, a plurality of ward lines WL, and memory cells MC provided between the bit lines BL and the ward lines WL. The memory cell MC includes a resistance change layer VR. That is, the memory unit MU includes a memory cell array including memory cells MC disposed in a matrix manner.

The control unit CU includes, for example, a column control circuit 302, a row control circuit 303, a data input/output buffer 304, an address register 305, a command/interface 306, a state machine 307, and a pulse generator 309.

The column control circuit 302 controls the bit line BL of the memory unit MU, for example, and deletes data in the memory cell MC, writes data in the memory cell MC, and reads out data from the memory cell MC. Writing of data corresponds to a set operation, for example, and deleting of data corresponds to a reset operation, for example.

The row control circuit 303 selects the ward line WL of the memory unit MU, for example, deletes data in the memory cell MC, writes data in the memory cell MC, and applies a voltage necessary for reading out of data from the memory cell MC to the ward line WL.

The data input/output buffer 304 is connected to an external host (not illustrated) of the non-volatile memory device 110 via an I/O line 312, for example. The data input/output buffer 304 receives data to be written and a delete command, outputs data to be read out, and receives address data and command data. The data input/output buffer 304 transmits received data to be written to the column control circuit 302, and receives read data from the column control circuit 302 and outputs the data to outside.

An address supplied to the data input/output buffer 304 from outside is transmitted to the column control circuit 302 and to the row control circuit 303 through the address register 305.

Further, a command supplied from the external host to the data input/output buffer 304 is transmitted to the command/interface 306.

The command/interface 306 receives an external control signal 311 supplied from the external host. The command/interface 306 determines whether the input data from the data input/output buffer 304 is data to be written, a command, or an address, and if it is a command, the command/interface 306 transmits the data to the state machine 307 as a command signal to be received.

The state machine 307 manages an operation of the non-volatile memory device 110. The state machine 307 supplies an internal control signal 313 to the column control circuit 302, the row control circuit 303, the data input/output buffer 304, the command/interface 306, and the pulse generator 309. The state machine 307 receives a command from the external host through the command/interface 306, for example, and performs management of reading out, writing, deleting, and inputting/outputting, and the like. Further, the external host can receives status information managed by the state machine 307, and can determine an operation result. The status information is also used to control writing and deleting.

The state machine 307 controls the pulse generator 309. With this control, the pulse generator 309 can output a pulse having an arbitrary voltage and timing.

The pulse output from the pulse generator 309 can be supplied to an arbitrary interconnection (bit line BL) controlled by the column control circuit 302 and an arbitrary interconnection (ward line WL) selected by the row control circuit 303.

Note that the control unit CU can be provided on a silicon substrate, for example, and the memory unit MU is provided on the control unit CU. Subsequently, a chip area of the non-volatile memory device 110 can be substantially equalized to the area of the memory unit MU.

Figure 20:
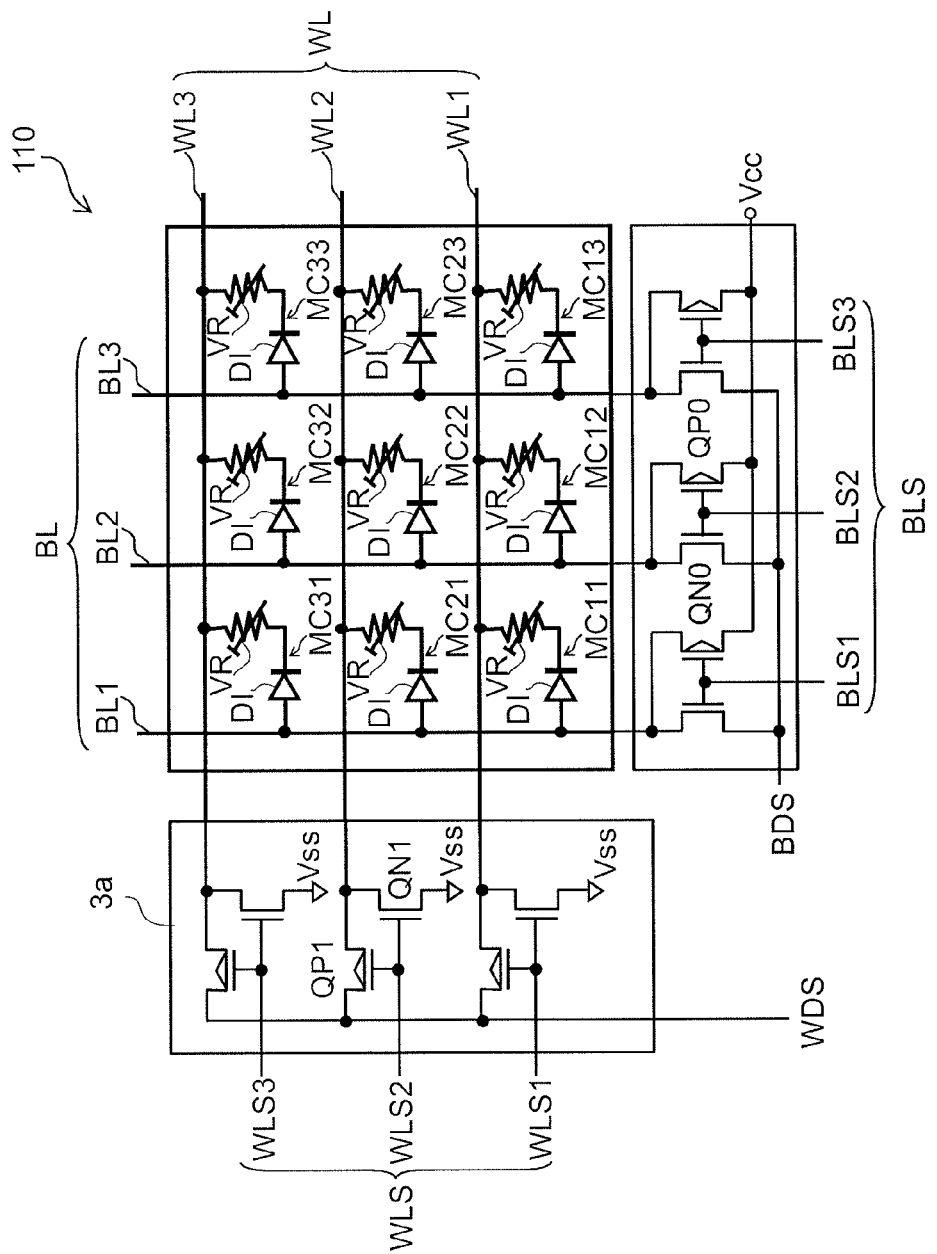
FIG. 20 is a circuit diagram illustrating the non-volatile memory device according to the fourth embodiment.

FIG. 20 is a circuit diagram illustrating a configuration of a non-volatile memory device according to the fourth embodiment. Although, in FIG. 20, three bit lines BL and three ward lines WL are drawn for simplification, the bit lines BL and the ward lines WL may take any numbers.

As shown in FIG. 20, the memory cells MC (memory cells MC11, MC12, M13, MC21, MC22, M23, MC31, MC32, M33, and the like) are provided intersections of the bit lines BL (first to third bit lines BL1 to BL3) and the ward lines WL (first third ward lines WL1 to WL3). In each of the memory cells MC, a resistance change layer VR and a rectifying device DI are connected in series.

Each of the bit lines BL is connected to a column-side selection circuit 302a. The column-side selection circuit 302a is included in the column control circuit 302. Further, each of the ward lines WL is connected to a row-side selection circuit 303a. The row-side selection circuit 303a is included in the row control circuit 303.

The column-side selection circuit 302a includes, for example, a set of a bit line-side selection PMOS transistor QP0 and a bit line-side selection NMOS transistor QN0 provided for each bit line BL. A gate of the bit line-side selection PMOS transistor QP0 and a gate of the bit line-side selection NMOS transistor QN0 are commonly connected. A drain of the bit line-side selection PMOS transistor QP0 and a drain of the bit line-side selection NMOS transistor QN0 are commonly connected.

A source of the bit line-side selection PMOS transistor QP0 is connected to a high electrical potential power source Vcc. The source of the bit line-side selection NMOS transistor QN0 is connected to a bit line-side drive-sense line BDS. The bit line-side drive-sense line BDS supplies a pulse to be written and supplies a current to be detected at the time of reading out data.

A common drain of the bit line-side selection PMOS transistor QP0 and the bit line-side selection NMOS transistor QN0 is connected to the bit line BL. Bit line selection signals BLS (first to third bit line selection signals BLS1 to BLS3) selecting respective bit lines BL are supplied to the common gate of the bit line-side selection PMOS transistor QP0 and the bit line-side selection NMOS transistor QN0.

The row-side selection circuit 303a includes, for example, a set of a ward line-side selection PMOS transistor QP1 and a ward line-side selection NMOS transistor QN1 provided for each ward line WL. A gate of the ward line-side selection PMOS transistor QP1 and a gate of the ward line-side selection NMOS transistor QN1 are commonly connected. A drain of the ward line-side selection PMOS transistor QP1 and a drain of the ward line-side selection NMOS transistor QN1 are commonly connected.

A source of the ward line-side selection PMOS transistor QP1 is connected to a ward line-side drive-sense line WDS. The ward line-side drive-sense line WDS supplies a pulse to be written and supplies a current to be detected at the time of reading out data. A source of the ward line-side selection NMOS transistor QN1 is connected to a low electrical potential power source Vss.

The common drain of the ward line-side selection PMOS transistor QP1 and the ward line-side selection NMOS transistor QN1 is connected to the ward line WL. Ward line selection signals WLS (first to third ward line selection signals WLS1 to WLS3) that select respective ward lines WL are supplied to the common gate of the ward line-side selection PMOS transistor QP1 and the ward line-side selection NMOS transistor QN1.

Note that the above configuration is an example suitable for the memory cells MC being individually selected.

Meanwhile, when data of a plurality of memory cells MC connected to a selected ward line WL is read out in a lump, a configuration can be employed in which sense amplifiers are individually disposed at respective bit lines BL, and each of the bit lines BL is individually connected to the sense amplifier with the bit line selection signal BLS through the column-side selection circuit 302a.

Figure 21:
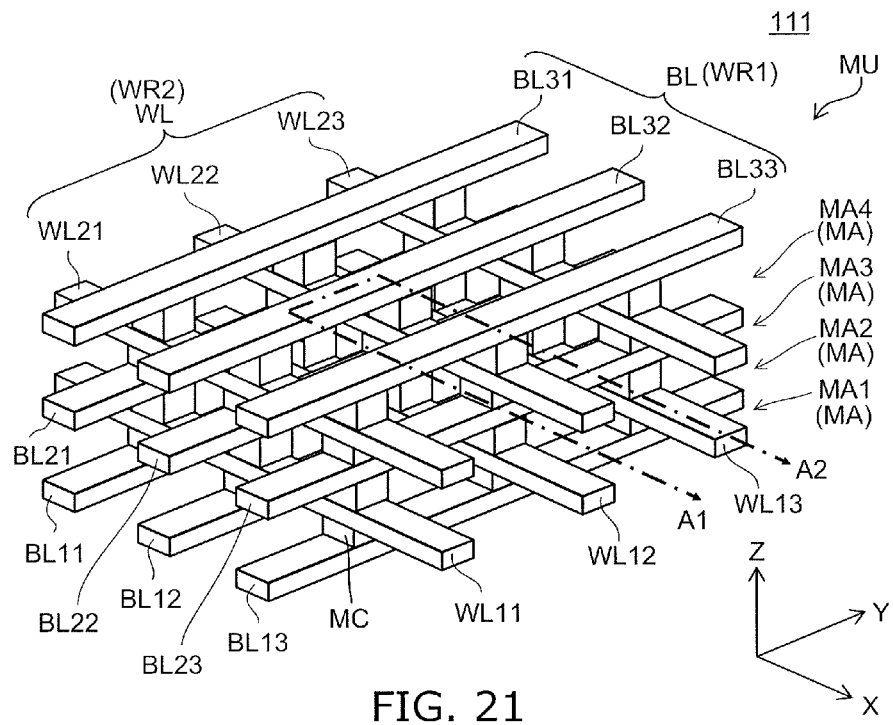
FIGS. 21 and 22 are schematic views illustrating the non-volatile memory device according to the fourth embodiment.

FIG. 21 is a schematic perspective view illustrating a configuration of a part of the non-volatile memory device according to the fourth embodiment.

Figure 22:
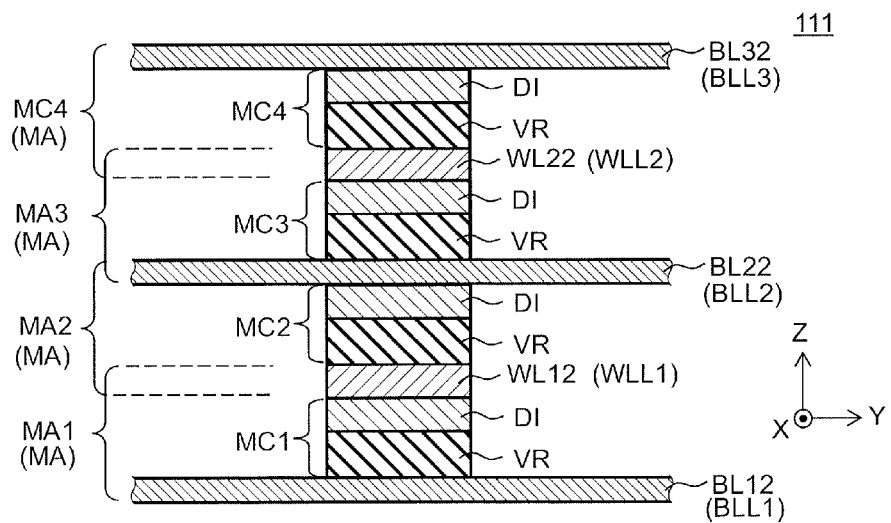

FIG. 22 is a schematic cross sectional view illustrating a configuration of a part of the non-volatile memory device according to the fourth embodiment. That is, FIG. 22 is an A1-A2 line cross sectional view of FIG. 21.

As shown in FIGS. 21 and 22, the memory unit MU in the non-volatile memory device 111 according to the embodiment includes a plurality of mutually stacked element memory layers MA. The plurality of element memory layers MA is stacked along the Z-axis direction, for example. In the specific example, four element memory layers MA, that is, first to fourth element memory layers MA1 to MA4 are provided. However, the element memory layers MA can employ any number.

Each of the element memory layers MA includes a first interconnection WR1, a second interconnection WR2, and a memory cell MC including a resistance change layer VR provided between the first interconnection WR1 and the second interconnection WR2.

That is, the first element memory layer MA1 includes a first layer bit line BLL1 (including the bit lines BL11, BL12, and BL13), a first layer ward line WLL1 (including the ward lines WL11, WL12, and WL13), and a first layer memory cell MC1.

The second element memory layer MA2 includes a second layer bit line BLL2 (including the bit lines BL21, BL22, and BL23), a first layer ward line WLL1 (including the ward lines WL11, WL12, and WL13), and a second layer memory cell MC2. The third element memory layer MA2 includes a second layer bit line BLL2 (including the bit lines BL21, BL22, and BL23), a second layer ward line WLL2 (including the ward lines WL21, WL22, and WL23), and a third layer memory cell MC3.

A fourth element memory layer MA4 includes a third layer bit line BLL3 (including bit lines the BL31, BL32, and BL33), a second layer ward line WLL2 (including ward lines the WL21, WL22, and WL23), and a fourth layer memory cell MC4.

In this way, in the non-volatile memory device 111, the bit lines BL and the ward lines WL are shared by the adjacent element memory layers MA along the Z-axis direction. However, the embodiment is not limited by the above description. For example, an interlayer insulating film may be provided between the adjacent element memory layers MA along the Z-axis direction, and each of the element memory layers MA may be provided with the bit lines BL and the ward lines WL. In this case, the bit lines BL and the ward lines WL in each of the element memory layers MA may take any extending direction.

The configuration described related to the non-volatile memory device 110 can be applied to the configuration of each of the element memory layers MA. The operations described related to the non-volatile memory devices 110, 120, and 130 can be applied to the operation of each of the element memory layers MA.

Note that, in the example shown in FIG. 22, the stacking orders of the resistance change layer VR and the rectifying device DI in the element memory layers MA are the same.

However, the resistance change layer VR and the rectifying device DI can employ any stacking order. For example, in the element memory layers MA adjacent along the Z-axis direction, the resistance change layer VR and the rectifying device DI may have an inversed stacking order.

Further, for example, the column control circuit 302 and the row control circuit 303 may be provided in each of the plurality of element memory layers MA, or may be shared among the plurality of element memory layers MA.

Further, a two-way diode, a transistor, and the like may be used as a switching device in place of the rectifying device DI, for example. In this case, the column control circuit 302 and the row control circuit 303 apply a control voltage between the first conductive layer 10 and the second conductive layer 20 of the memory cell MC through the bit lines BL and the ward lines WL. Further, a control unit CU (for example, the column control circuit 302, the row control circuit 303, and the like) performs a first operation of causing the electrical potential of the first conductive layer 10 to be higher than that of the second conductive layer 20 and a second operation of causing the electrical potential of the second conductive layer 20 to be higher than that of the first conductive layer 10.

<Fifth Embodiment>

Figure 23:
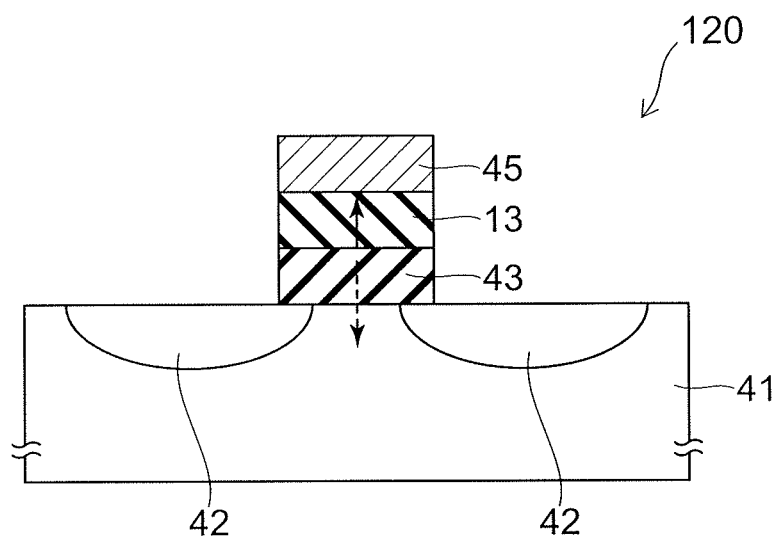
FIG. 23 is a schematic cross-sectional view illustrating a non-volatile memory device according to a fifth embodiment.

FIG. 23 is a schematic cross sectional view illustrating a configuration of a non-volatile memory device according to a fifth embodiment.

As shown in FIG. 23, a non-volatile memory device 120 according to the embodiment includes, for example, a flash memory type memory cell. The memory cell has a configuration of a metal-insulator-semiconductor (MIS) transistor.

In the embodiment, a diffusion layer 42 is formed on a surface region of a semiconductor substrate 41. A gate insulating layer 43 is formed on a channel region between the diffusion layers 42. A memory layer 13 is formed on the gate insulating layer 43. A control gate electrode 45 is formed on the memory layer 13.

The semiconductor substrate 41 may be a well region, and the semiconductor substrate 41 and the diffusion layer 42 have mutually opposite conductivity types. The control gate electrode 45 serves as a ward line. Conductive polysilicon is used for the control gate electrode 45, for example.

The memory layer 13 can have any configuration described in the first to third embodiments. For example, the semiconductor substrate 41 corresponds to the first conductive layer 10, the control gate electrode 45 corresponds to the second conductive layer 20, and the memory layer 13 corresponds to the resistance change layer 30. The gate insulating layer 43 corresponds to the intermediate layer 11, for example. Alternatively, the memory layer 13 may include the first conductive layer 10, the resistance change layer 30, and the second conductive layer 20.

In this example, a driving unit (for example, a control unit CU) is connected to the control gate electrode 45. The driving unit performs at least one of applying a voltage to the memory layer 13 or supplying a current to the memory layer 13, through the control gate electrode 45.

Note that, in the above description, first conductive layer 10 or the second conductive layer 20 provided in contact with the memory layer 13 may also be used as the control gate electrode 45.

According to the embodiments, a non-volatile memory device is provided, which may improve the characteristics.

Embodiments of the invention have been described with reference to specific examples. However, the invention is not limited by these examples. For example, specific configurations of elements included in the non-volatile memory device, such as the first conductive layer, the second conductive layer, the resistance change layer, the first and second interconnections, and the control unit are included within the scope of the invention as long as person skilled in the art similarly performs the invention by appropriately selecting the elements from a known scope and can obtain similar effects.

Further, combination of any two or more elements from the specific examples within a technically possible scope is included within the scope of the invention as long as the combination contains the concept of the invention.

Other than the above, all non-volatile memory devices obtained by person skilled in the art appropriately changing the design of the non-volatile memory device described as the embodiments of the invention belong to the scope of the patent application as long as the non-volatile memory devices include the substance of the invention.

Other than the above, it is understood that person skilled in the art would reach various alternations and modifications within the idea of the invention, and the alternations and modifications belong to the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
    a first conductive layer;
    a second conductive layer; and
    a resistance change layer provided between the first conductive layer and the second conductive layer, the resistance change layer being converted reversibly from a low-resistance state to a high-resistance state, and including an oxide containing at least one of hafnium (Hf) and zirconium (Zr), at least one selected from the group consisting of barium (Ba), lanthanum (La), gadolinium (Gd) and lutetium (Lu), and nitrogen (N) wherein
    the resistance change layer includes a first part and a second part provided between the second conductive layer and the first part; and
    a first value is smaller than a second value, the first value being obtained by dividing an absolute difference between a first nitrogen concentration in the first part and a second nitrogen concentration in the second part by lower one of the first nitrogen concentration and the second nitrogen concentration, and the second value being obtained by dividing an absolute difference between a first concentration, in the first part, of the one element selected from the group and a second concentration of the one element in the second part by lower one of the first concentration of the one element and the second concentration of the one element.

2. The device according to claim 1, wherein the oxide includes a metal site containing one of Hf, Zr, Ba, La, Gd, and Lu, and an oxygen site replaced with nitrogen.

3. The device according to claim 1, wherein a ratio of nitrogen with respect to oxygen is one sixteenth or more, and one fourth or less.

4. The device according to claim 1, wherein a thickness of the second part in a first direction from the first conductive layer to the second conductive layer is larger than a thickness of the first part in the first direction.

5. The device according to claim 4, wherein the first part is provided in a vicinity of the first conductive layer.

6. The device according to claim 1, wherein
    a concentration, in the first part, of the one element selected from the group is higher than a concentration of the one element in the second part.

7. The device according to claim 1, wherein
    a concentration, in the first part, of the one element selected from the group is higher than a concentration of the one element in the second part, and
    nitrogen is distributed more uniformly than the one element in the resistance change layer.

8. The device according to claim 1, further comprising an intermediate layer provided between the first conductive layer and the resistance change layer,
    wherein the intermediate layer includes a silicon oxide film or a silicon oxynitride film.

9. A non-volatile memory device comprising:
    a first conductive layer;
    a second conductive layer; and
    a resistance change layer provided between the first conductive layer and the second conductive layer, the resistance change layer being capable of making a transition between a low-resistance state and a high-resistance state, and including an oxide containing at least one of hafnium (Hf) and zirconium (Zr), at least one selected from the group consisting of barium (Ba), lanthanum (La), gadolinium (Gd) and lutetium (Lu), and nitrogen (N),
    wherein the oxide further contains fluorine (F),
    the resistance change layer includes a first part and a second part provided between the second conductive layer and the first part, and
    a concentration of fluorine in the first part is higher than a concentration of fluorine in the second part.

10. The device according to claim 9, wherein the oxide includes a metal site containing at least one of Hf, Zr, Ba, La, Gd, and Lu, an oxygen site replaced with nitrogen, and an oxygen site replaced with fluorine.

11. The device according to claim 9, wherein a concentration, in the first part, of the one element selected from the group is higher than a concentration of the one element in the second part, and
    a fluorine concentration in the first part is higher than a fluorine concentration in the second part.

12. The device according to claim 9, wherein a ratio of fluorine with respect to oxygen in the first part is one sixteenth or more, and one fourth or less.

13. The device according to claim 9, wherein nitrogen is distributed more uniformly than fluorine in the resistance change layer.

14. The device according to claim 1, further comprising:
    a control unit electrically connected with the first conductive layer and the second conductive layer, and applying a voltage between the first conductive layer and the second conductive layer,
    wherein the control unit applies a higher electrical potential to the first conductive layer than an electrical potential applied to the second conductive layer in a first operation, and applies a higher electrical potential to the second conductive layer than an electrical potential applied to the first conductive layer in a second operation.

15. The device according to claim 1, further comprising:
    a first interconnection electrically connected to the first conductive layer;

a second interconnection electrically connected to the second conductive layer, and intersecting with the first interconnection, the first conductive layer, the second conductive layer, and the resistance change layer being disposed between the first interconnection and the second interconnection; and a switching device provided between one of the first interconnection and the second interconnection, and the resistance change layer.

* * * * *